United States Patent
Hayashi et al.

(10) Patent No.: US 7,642,149 B2
(45) Date of Patent: Jan. 5, 2010

(54) METHOD FOR PRODUCING SEMICONDUCTOR DEVICE

(75) Inventors: Tetsuya Hayashi, Yokosuka (JP);
Masakatsu Hoshi, Yokohama (JP);
Hideaki Tanaka, Yokohama (JP);
Shigeharu Yamagami, Yokohama (JP)

(73) Assignee: Nissan Motor Co., Ltd., Yokohama-shi (JP)

( * ) Notice: Subject to any disclaimer, the term of this patent is extended or adjusted under 35 U.S.C. 154(b) by 84 days.

(21) Appl. No.: 11/907,401

(22) Filed: Oct. 11, 2007

(65) Prior Publication Data

US 2008/0108211 A1  May 8, 2008

(30) Foreign Application Priority Data

Oct. 17, 2006  (JP)  ............................. 2006-282504
Jun. 15, 2007  (JP)  ............................. 2007-158860

(51) Int. Cl.
*H01L 21/8238* (2006.01)

(52) U.S. Cl. ....................................... 438/206

(58) Field of Classification Search ........................ None
See application file for complete search history.

(56) References Cited

U.S. PATENT DOCUMENTS 5,985,708 A * 11/1999 Nakagawa et al. .......... 438/206
6,724,019 B2 * 4/2004 Oda et al. .................. 257/195
7,009,261 B2 * 3/2006 Nakashima ................. 257/378
2002/0030233 A1  3/2002 Kubo et al.
2003/0094650 A1  5/2003 Huang et al.

FOREIGN PATENT DOCUMENTS

EP  1 638 148 A2  3/2006
JP  2003-318398 A  11/2003

OTHER PUBLICATIONS

M. H. Juang et al., "The formation of trench-gate power MOSFETs with a SiGe channel region", Institute of Physics Publishing, Semiconductor Science and Technology, vol. 21, No. 6, Jun. 1, 2006, pp. 799-802.

* cited by examiner

*Primary Examiner*—Charles D Garber
*Assistant Examiner*—Andre' C Stevenson
(74) *Attorney, Agent, or Firm*—Foley & Lardner LLP

(57) ABSTRACT

A method for producing a semiconductor device which includes: a semiconductor base, a hetero semiconductor region made of a semiconductor material different in band gap from a semiconductor material for the semiconductor base, and so configured as to form a hetero junction in combination with the semiconductor base, a gate insulating film so configured as to contact with the hetero junction between the semiconductor base and the hetero semiconductor region, a gate electrode so configured as to contact with the gate insulating film, a source electrode connected to the hetero semiconductor region, and a drain electrode connected to the semiconductor base. The method includes: forming the following in a self-aligning manner, by using a certain mask material: a source contact hole for the source electrode, and the gate electrode.

10 Claims, 18 Drawing Sheets

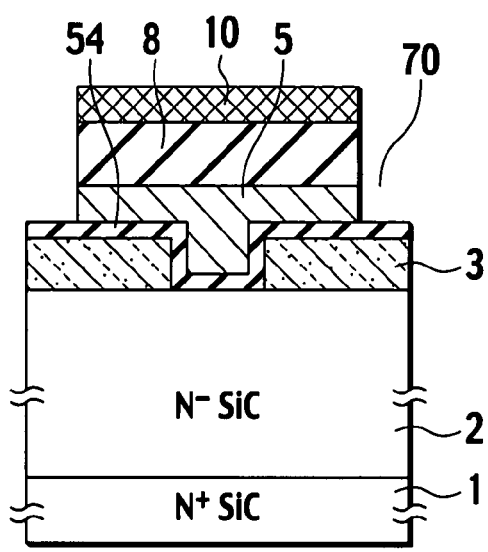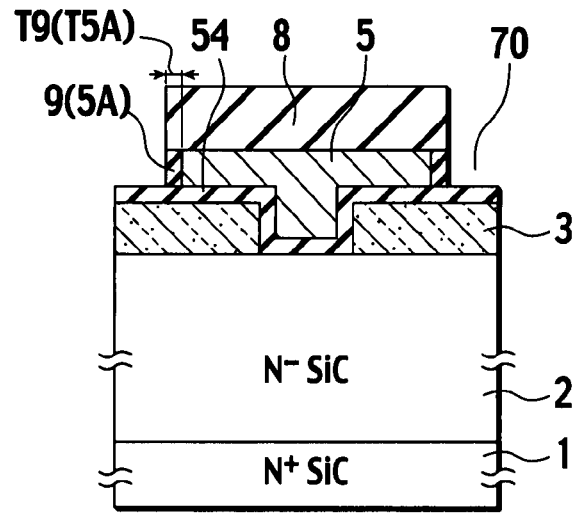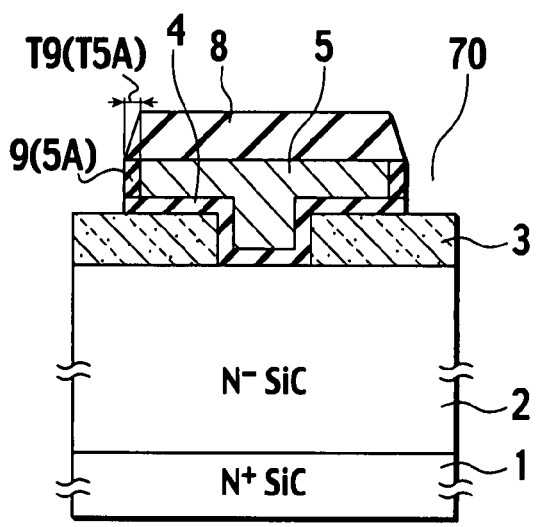

METHOD FOR PRODUCING SEMICONDUCTOR DEVICE

BACKGROUND OF THE INVENTION

1. Field of the Invention

The present invention relates to a method for producing a semiconductor device having a hetero semiconductor region forming a hetero junction in combination with a semiconductor base.

2. Description of the Related Art

Japanese Patent Application Laid-Open No. 2003-318398 (=JP2003318398) discloses a conventional semiconductor device. An N− type polycrystalline silicon region is so formed as to contact a first main face of a semiconductor base having an N− type silicon carbide epitaxial region formed on an N+ type silicon carbide substrate. In the conventional semiconductor device, the N− type silicon carbide epitaxial region and the N− type polycrystalline silicon region in combination form a hetero junction. Moreover, adjacent to the hetero junction between the N− type silicon carbide epitaxial region and the N− type polycrystalline silicon region, a gate electrode is formed via a gate insulating film. The N− type polycrystalline silicon region is connected to a source electrode via a source contact hole formed in an interlayer insulating film, while the N+ type silicon carbide substrate has a backface formed with a drain electrode.

In the above conventional semiconductor device, the gate electrode and the source contact hole are formed by different mask materials.

SUMMARY OF THE INVENTION

It is an object of the present invention to provide a method for producing a semiconductor device which is decreased in size by decreasing distance between a gate electrode and a source contact hole.

According to a first aspect of the present invention, there is provided a method for producing a semiconductor device which includes: a semiconductor base, a hetero semiconductor region made of a semiconductor material different in band gap from a semiconductor material for the semiconductor base, and so configured as to form a hetero junction in combination with the semiconductor base, a gate insulating film so configured as to contact with the hetero junction between the semiconductor base and the hetero semiconductor region, a gate electrode so configured as to contact with the gate insulating film, a source electrode connected to the hetero semiconductor region, and a drain electrode connected to the semiconductor base, the method comprising: forming the following in a self-aligning manner, by using a certain mask material: a source contact hole for the source electrode, and the gate electrode.

Other objects and features of the present invention will become understood from the following description with reference to the accompanying drawings.

BRIEF DESCRIPTION OF THE DRAWINGS

FIG. 3A, FIG. 3B and FIG. 3C are cross sectional views showing operations following those in FIG. 2.

DESCRIPTION OF THE PREFERRED EMBODIMENTS

In the following, various embodiments of the present invention will be described in detail with reference to the accompanying drawings.

For ease of understanding, the following description will contain various directional terms, such as left, right, upper, lower, forward, rearward and the like. However, such terms are to be understood with respect to only a drawing or drawings on which the corresponding part of element is illustrated.

Hereinafter, a method for producing a semiconductor device 21 is to be set forth referring to FIG. 1 to FIG. 12, according to first to fifth embodiments of the present invention.

First Embodiment

<Structure>

Figure 1:
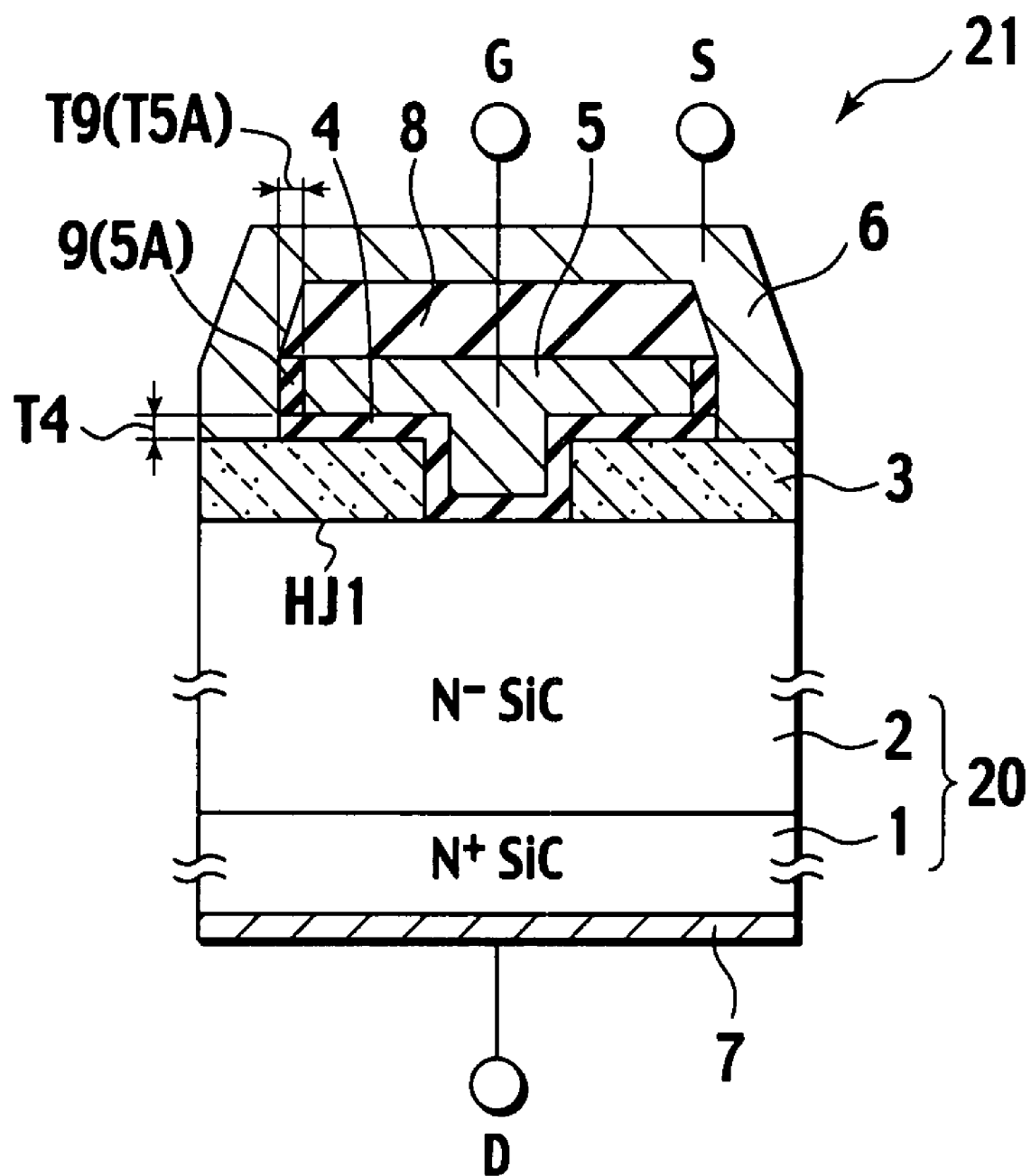
FIG. 1 is a cross sectional view showing a structure of a semiconductor device produced by a method, according to a first embodiment of the present invention.

At first, the semiconductor device 21 produced by the method according to the first embodiment is to be set forth, referring to FIG. 1. FIG. 1 is a cross sectional view showing a structure of the semiconductor device 21 produced by the method, according to the first embodiment of the present invention. The semiconductor device 21 in FIG. 1 according to the first embodiment has such a structure that two unit cells of a field effect transistor are opposed. Actually, however, a plurality of unit cells of the field effect transistor are arranged in parallel and connected with each other, thus forming one transistor.

The semiconductor device 21 in FIG. 1 has a semiconductor base 20 including a substrate region 1 and a drift region 2. The substrate region 1 is made of 4H type (poly type) silicon carbide having N type high impurity concentration (N+). The N− type drift region 2 made of silicon carbide having N type low impurity concentration (N−) is formed on a surface of the substrate region 1.

Corresponding to each of the unit cells of the field effect transistor, the semiconductor device 21 in FIG. 1 further includes:

1) a hetero semiconductor region 3 formed in a certain region of a surface of the drift region 2, which surface is opposed to a junction interface between the drift region 2 and the substrate region 1, 2) a gate insulating film 4 formed on the surface of the drift region 2 and on the surface and sideface of the hetero semiconductor region 3, in such a configuration as to contact a hetero junction HJ1 between the drift region 2 and the hetero semiconductor region 3, 3) a gate electrode 5 formed in such a configuration as to contact with the gate insulating film 4, 4) a source electrode 6 directly connected to the hetero semiconductor region 3's surface opposed to the hetero junction HJ1 between the hetero semiconductor region 3 and the drift region 2, 5) a drain electrode 7 having an ohmic connection with a backface of the substrate region 1 at a low resistance, and 6) an interlayer insulating film 8 and an insulating region 9 which are configured to insulate the gate electrode 5 from the source electrode 6.

Herein, the hetero semiconductor region 3 according to the first embodiment is made of N type polycrystalline silicon which is a semiconductor material having a band gap different from that of the drift region 2. The hetero semiconductor region 3 and the drift region 2 in combination form the hetero junction HJ1. Therefore, the hetero junction HJ1 between the drift region 2 and the hetero semiconductor region 3 has an energy barrier ΔEc. Moreover, the gate insulating film 4 is made of silicon oxidized film <Production Method>

Then, the method for producing the semiconductor device 21 according to the first embodiment is to be set forth, referring to FIG. 2 to FIG. 3. FIGS. 2A, 2B, 2C and 2D are cross sectional views showing operations for producing the semiconductor device 21 in FIG. 1. FIGS. 3A, 3B and 3C are cross sectional views showing operations following those in FIG. 2. At first, as shown in FIG. 2A, the N− type drift region 2 is epitaxially grown on the N+ type substrate region 1, thus forming the semiconductor base 20. Then, a polycrystalline silicon layer 53 is formed on the semiconductor base 20 by, for example, an LP-CVD (Low Pressure Chemical Vapor Deposition) method. Then, an impurity, i.e., phosphor (P) or arsenic (As) is introduced into the polycrystalline silicon layer 53 by, for example, an ion implantation method, thus forming an N type polycrystalline silicon layer 53. Then, as shown in FIG. 2B in combination with FIG. 2A, a certain mask material (not shown) is formed on the N type polycrystalline silicon layer 53 by, for example, photolithography. Then, the polycrystalline silicon layer 53's region opened by the mask material made of photoresist is etched by a reactive ion etching (dry etching), thus forming the hetero semiconductor region 3. Thereafter, the certain mask material is removed.

Figure 2A:
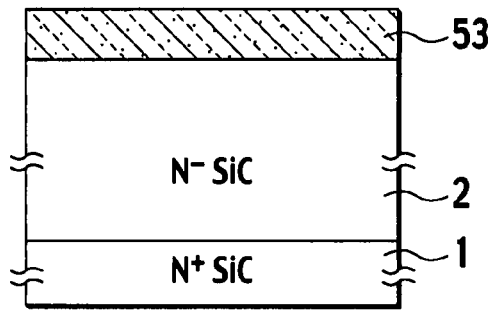
FIG. 2A, FIG. 2B, FIG. 2C and FIG. 2D are cross sectional views showing operations for producing the semiconductor device in FIG. 1.
Figure 2B:
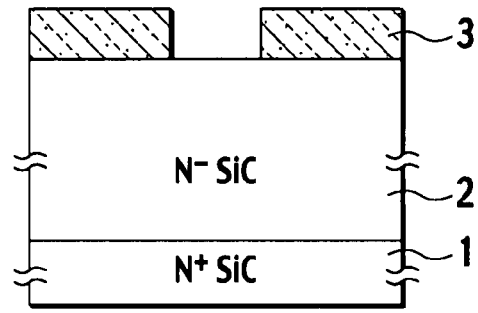
Figure 2C:
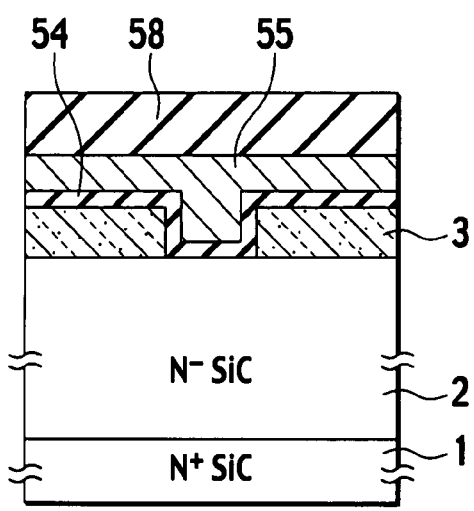
Figure 2D:
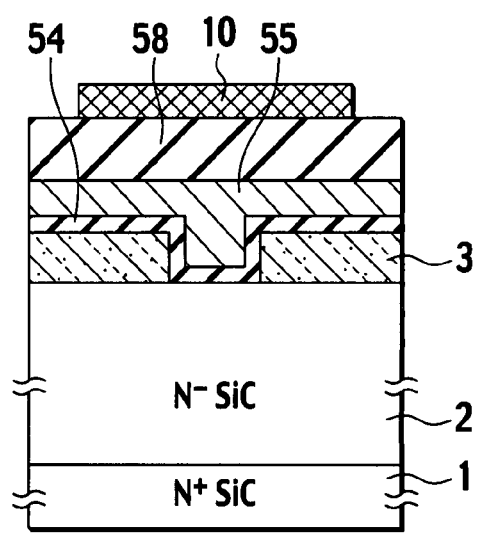

Then, as shown in FIG. 2C, a gate insulating film layer 54 made of silicon oxidized film is formed on the hetero semiconductor region 3 and the drift region 2's exposed surface by, for example, the LP-CVD method. Then, a gate electrode layer 55 made of polycrystalline silicon is deposited by, for example, the LP-CVD method. Then, an impurity, i.e., phosphor or arsenic is introduced into the gate electrode layer 55 by, for example, the ion implantation method, thus forming an N type gate electrode layer 55. Moreover, before the gate electrode 5 is formed by patterning the gate electrode layer 55, an interlayer insulating film layer 58 is formed by the CVD method. Then, as shown in FIG. 2D, a certain mask material 10 made of photoresist is formed on the interlayer insulating film layer 58 by, for example, the photolithography. Then, as shown in FIG. 3A, the interlayer insulation film layer 58 and the gate electrode layer 55 are selectively etched and patterned by, for example, the reactive ion etching (dry etching). Operations in FIG. 3A form the interlayer insulating film 8 and pattern the gate electrode 5 and substantially simultaneously form a source contact hole 70 for the source electrode 6. Then, as shown in FIG. 3B, after the mask material 10 is removed, the gate electrode 5's sideface layer (hereinafter referred to as "sideface layer 5A") exposed by the etching is oxidized by, for example, a heat oxidizing method, thus forming the insulating region 9. Besides, thickness T5A of the sideface layer 5A subjected to the heat oxidizing is fine-controllable, depending on type, temperature and time period of the oxidizing method such as dry $O_2$ oxidizing method, $H_2O$ oxidizing method and the like. Therefore, a lower limit of the thickness T5A of the sideface layer 5A can be easily accomplished for at least insulating the gate electrode 5 from the source electrode 6.

Then, as shown in FIG. 3C, the gate insulating film layer 54 is etched by, for example, the reactive ion etching (dry etching), thus exposing the surface of the hetero semiconductor region 3 partly and forming the gate insulating film 4. During the etching operation for the gate insulating film 4, an upper part of the insulating region 9 is covered with the interlayer insulating film 8. Therefore, the dry etching method scarcely etches the insulating region 9, thus substantially keeping thickness T9 (=thickness T5A) obtained by the operation in FIG. 3B. Moreover, in the method for producing the semiconductor device 21 according to the first embodiment, the insulating region 9 is made of silicon oxidized film formed by the heat oxidizing method while the interlayer insulating film 8 is made of silicon oxidized film formed by the CVD method. Thereby, an etching rate difference allows the interlayer insulating film 8 to be cut to have an inclination such that an open part to serve as a source contact part expands, bringing about an advantage that the source electrode 6 has good coverage property, which is described afterward. Finally, as shown in FIG. 1, the drain electrode 7 made of, for example, titanium (Ti) or nickel (Ni) is formed on the backface side of the substrate region 1. The source electrode 6 made of, for example, titanium (Ti) or aluminum (Al) is formed in such a configuration as to inconsecutively contact with the exposed face of the hetero semiconductor region 3, the sideface of the gate insulating film 4, the sideface of the insulating region 9 and the interlayer insulating film 8. With this, the semiconductor device 21 according to the first embodiment is finally produced.

<Operation>

Then, basic operations of the semiconductor device 21 in FIG. 1 are to be set forth. The semiconductor device 21 in FIG. 1 can keep a cutoff state, for example, when the source electrode 6 is grounded, a positive potential is applied to the drain electrode 7 and the gate electrode 5 is grounded or has a negative potential. That is, as set forth above, the hetero junction HJ1 between the hetero semiconductor region 3 and the drift region 2 has the energy barrier $\Delta Ec$ to a conduction electron, thus scarcely allowing current flow from the drain electrode 7 to the source electrode 6. Meanwhile, applying positive potential to the gate electrode 5 for converting from the cutoff state to a conduction state extends a gate electric field to the hetero semiconductor region 3 and the drift region 2's surface layer via the gate insulating film 4. On the hetero junction HJ1 between the hetero semiconductor region 3 and the drift region 2, the gate electric field forms an accumulated layer of electron. Then, the hetero semiconductor region 3 and the drift region 2's surface layer have a potential for allowing freedom electron to exist, making the energy barrier $\Delta Ec$ (which so far was extending to the drift region 2 side) precipitous and decreasing thickness of the energy barrier $\Delta Ec$. As a result, a tunnel phenomenon allows conduction of electron current. Then, applying the ground potential again to the gate electrode 5 for converting from the conduction state to the cutoff state cancels the accumulated state of the conduction electron formed in the hetero junction HJ1 between the hetero semiconductor region 3 and the drift region 2, thus stopping the tunneling in the energy barrier $\Delta Ec$. Then, the conduction electron flow from the hetero semiconductor region 3 to the drift region 2 stops. Moreover, the conduction electron in the drift region 2 flows to the substrate region 1 and is depleted. Then, a depletion layer expands from the hetero junction HJ1 on the drift region 2 side, thus bringing about the cutoff state.

Moreover, like the conventional structure, the first embodiment of the present invention can have, for example, an opposite conduction (i.e., reflux operation or opposite bias) with the source electrode 6 grounded and a negative potential applied to the drain electrode 7. For example, grounding the source electrode 6 and gate electrode 5 and applying a certain negative potential to the drain electrode 7 delete the energy barrier $\Delta Ec$ to the conduction electron, thus flowing the conduction electron from the drift region 2 side to the hetero semiconductor region 3 side, thereby bringing about the opposite conduction state (reflux). In this case, the conduction electron alone makes the conduction without injection of positive holes, thereby decreasing a loss which may be caused by an opposite recovery current in the conversion from the opposite conduction state to the cutoff state. Otherwise, instead of being grounded, the above described gate electrode 5 can serve as a control electrode.

As set forth above, the method for producing the semiconductor device 21 according to the first embodiment has the operation for forming the source contact hole 70 (for the source electrode 6) and the gate electrode 5 in a self-aligning manner by using the mask material 10. Therefore, patterning of the gate electrode 5 and forming of the source contact hole 70 are accomplished by the same mask material 10 and the same operation. With this, distance between the gate electrode 5 and the source contact hole 70 can be decreased.

Moreover, the sideface layer 5A is subjected to the heat oxidizing, to thereby form the insulating region 9. Thereby, the thickness T9 of the insulating region 9 is fine-controllable, depending on type, temperature and time period of the oxidizing method such as dry $O_2$ oxidizing method, $H_2O$ oxidizing method and the like. Therefore, a lower limit of the thickness T9 can be easily accomplished for at least insulating the gate electrode 5 from the source electrode 6.

With this, compared with the conventional production method, the unit cells of the field effect transistor can be made smaller, thus integrating a plurality of cells of the field effect transistor, thereby driving the semiconductor device 21 at higher current density. With this, on-resistance of the semiconductor device 21 can be decreased.

Moreover, the sideface layer 5A is subjected to the heat oxidizing, to thereby form the insulating region 9. With this, the thicknesses T9 defined at both ends of the gate electrode 5 are unified, thus improving basic performance (such as insulation, reliability and the like) of the semiconductor device 21. Thereby, the transistor per se, which includes a plurality of unit cells (of the field effect transistor) arranged in parallel and connected with each other, can have an improved basic performance.

Second Embodiment

Figure 4:
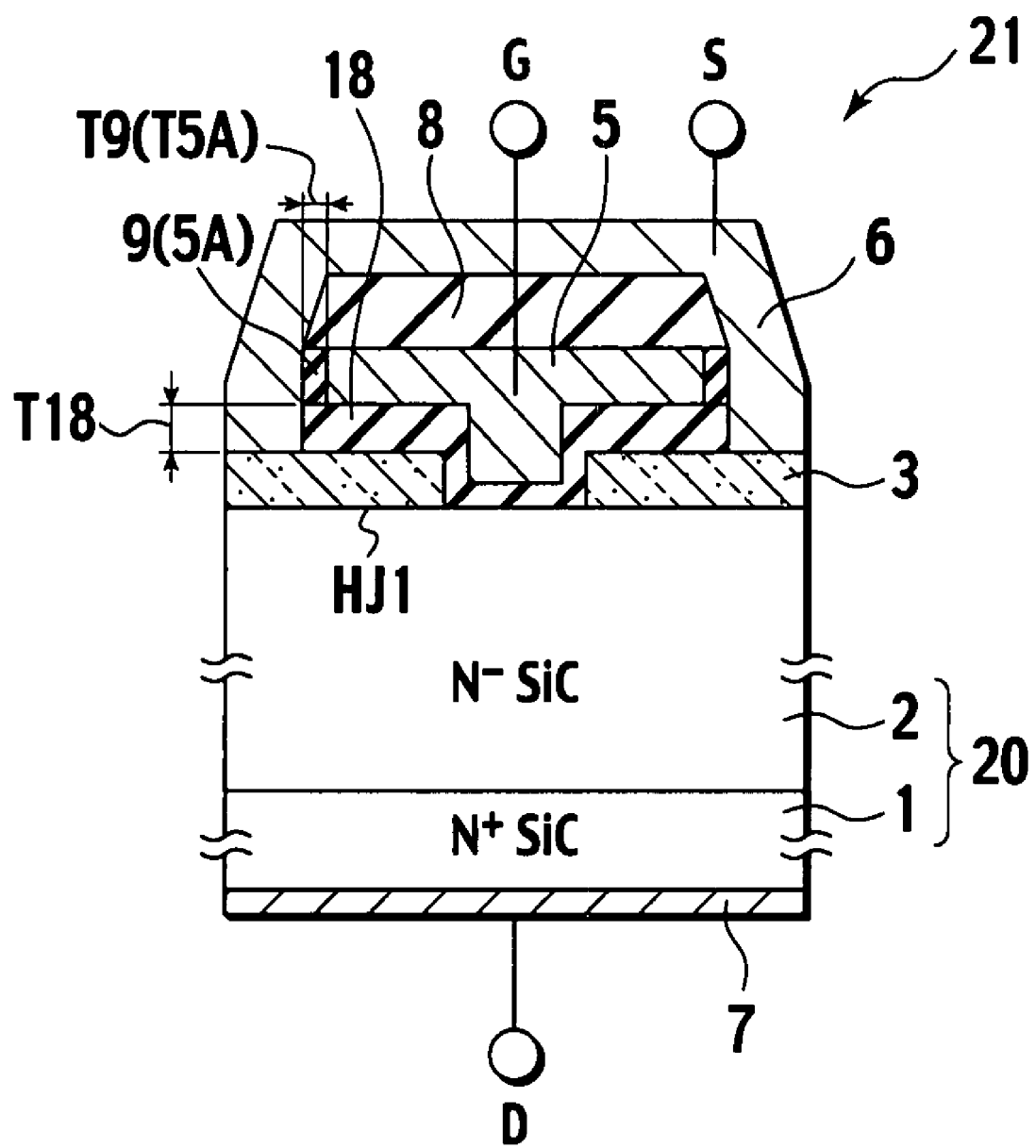
FIG. 4 is a cross sectional view showing a structure of the semiconductor device produced by a method, according to a second embodiment of the present invention.

Then, a method for producing the semiconductor device 21 according to the second embodiment is to be set forth referring to FIG. 4 to FIG. 5, focusing on points different from those of the method according to the first embodiment. Moreover, the semiconductor device 21 produced by the method according to the second embodiment has the same reference numerals or signs for structural elements like those according to the first embodiment, and therefore repeated description of the like structural elements is to be omitted.

<Structure>

At first, the semiconductor device 21 produced by the method according to the second embodiment is to be set forth, referring to FIG. 4. FIG. 4 is a cross sectional view showing a structure of the semiconductor device 21 produced by the method, according to the second embodiment of the present invention. As shown in FIG. 4, basically, the semiconductor device 21 according to the second embodiment has the structure substantially the same as that of the semiconductor device 21 according to the first embodiment. The semiconductor device 21 according to the second embodiment differs from the semiconductor device 21 according to the first embodiment in that a thickness T18 of a gate insulating film 18 formed on the surface of the hetero semiconductor region 3 is larger than a thickness T4 of the gate insulating film 4 according to the first embodiment. With this, an effect like that brought about according to the first embodiment can be brought about according to the second embodiment. Moreover, the thus increased thickness T18 of the gate insulating film 18 can further improve the insulating property and reliability of the gate insulating film 18.

<Production Method>

Figure 5A:
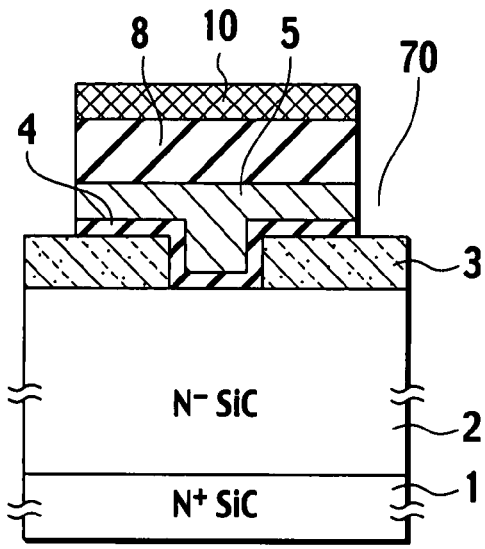
FIG. 5A, FIG. 5B and FIG. 5C are cross sectional views showing operations for producing the semiconductor device in FIG. 4.
Figure 5B:
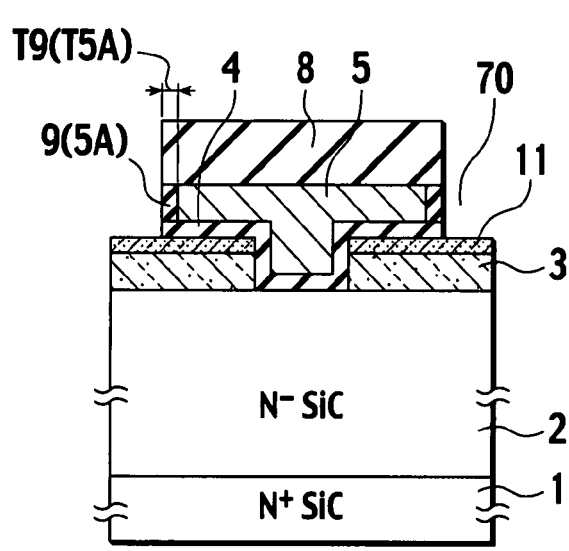
Figure 5C:
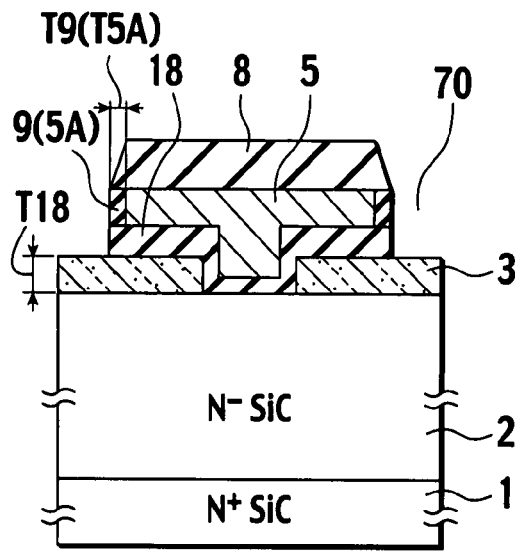

Then, the method for producing the semiconductor device 21 according to the second embodiment is to be set forth, referring to FIG. 5. FIGS. 5A, 5B and 5C are cross sectional views showing operations for producing the semiconductor device 21 in FIG. 4. The method for producing the semiconductor device 21 according to the second embodiment has in advance substantially the same operations in FIG. 2A to FIG. 2D according to the first embodiment. According to the second embodiment, then, as shown in FIG. 5A in combination with FIG. 2D, the interlayer insulating film layer 58, the gate electrode layer 55 and the gate insulating film layer 54 are selectively etched by, for example, the reactive ion etching (dry etching) and then are patterned. The operation in FIG. 5A forms the interlayer insulating film 8 and gate insulating film 4 and patterns the gate electrode 5, and substantially simultaneously forms the source contact hole 70 for the source electrode 6. Then, as shown in FIG. 5B, the mask material 10 is removed, and then the sideface layer 5A exposed by the etching is oxidized by, for example, the heat oxidizing method, to thereby form the insulating region 9. According to the second embodiment, the heat oxidizing progresses from the hetero semiconductor region 3's surface exposed by the operation in FIG. 5A, thus forming a hetero semiconductor oxidized region 11 also on the surface layer of the hetero semiconductor region 3. Like the first embodiment, the thickness T5A of the sideface layer 5A subjected to the heat oxidizing is fine-controllable, depending on type, temperature and time period of the oxidizing method such as dry $O_2$ oxidizing method, $H_2O$ oxidizing method and the like. Therefore, a lower limit of the thickness T5A of the sideface layer 5A can be easily accomplished for at least insulating the gate electrode 5 from the source electrode 6.

Then, as shown in FIG. 5C, the hetero semiconductor oxidized region 11 is etched by, for example, the reactive ion etching (dry etching), thus exposing the surface of the hetero semiconductor region 3 and forming the gate insulating film 18. That is, the gate insulating film 18 is made from the gate insulating film 4 and the hetero semiconductor oxidized region 11. In the operation in FIG. 5C, the dry etching method allows the interlayer insulating film 8 to cover an upper part of the insulating region 9. Therefore, the dry etching method scarcely etches the insulating region 9, thus substantially keeping the thickness T9 obtained by the operation in FIG. 5B. Moreover, in the method for producing the semiconductor device 21 according to the second embodiment, the insulating region 9 is made of the silicon oxidized film formed by the heat oxidizing method while the interlayer insulating film 8 is made of the silicon oxidized film formed by the CVD method. Thereby, the etching rate difference allows the interlayer insulating film 8 to be cut to have an inclination such that an open part to serve as a source contact part expands, bringing about an advantage that the source electrode 6 has good coverage property, which is described afterward. Finally, as shown in FIG. 4, the drain electrode 7 is formed by the operation like that according to the first embodiment. The source electrode 6 is formed in such a configuration as to inconsecutively contact with the exposed face of the hetero semiconductor region 3, the sideface of the gate insulating film 18, the sideface of the insulating region 9 and the interlayer insulating film 8. With this, the semiconductor device 21 according to the second embodiment is finally produced.

As set forth above, the method for producing the semiconductor device 21 according to the second embodiment can bring about an effect like that brought about according to the first embodiment, and can have the increased thickness T18 of the gate insulating film 18 (T4<T18), thus further improving the insulating property and reliability of the gate insulating film 18.

Third Embodiment

Figure 6:
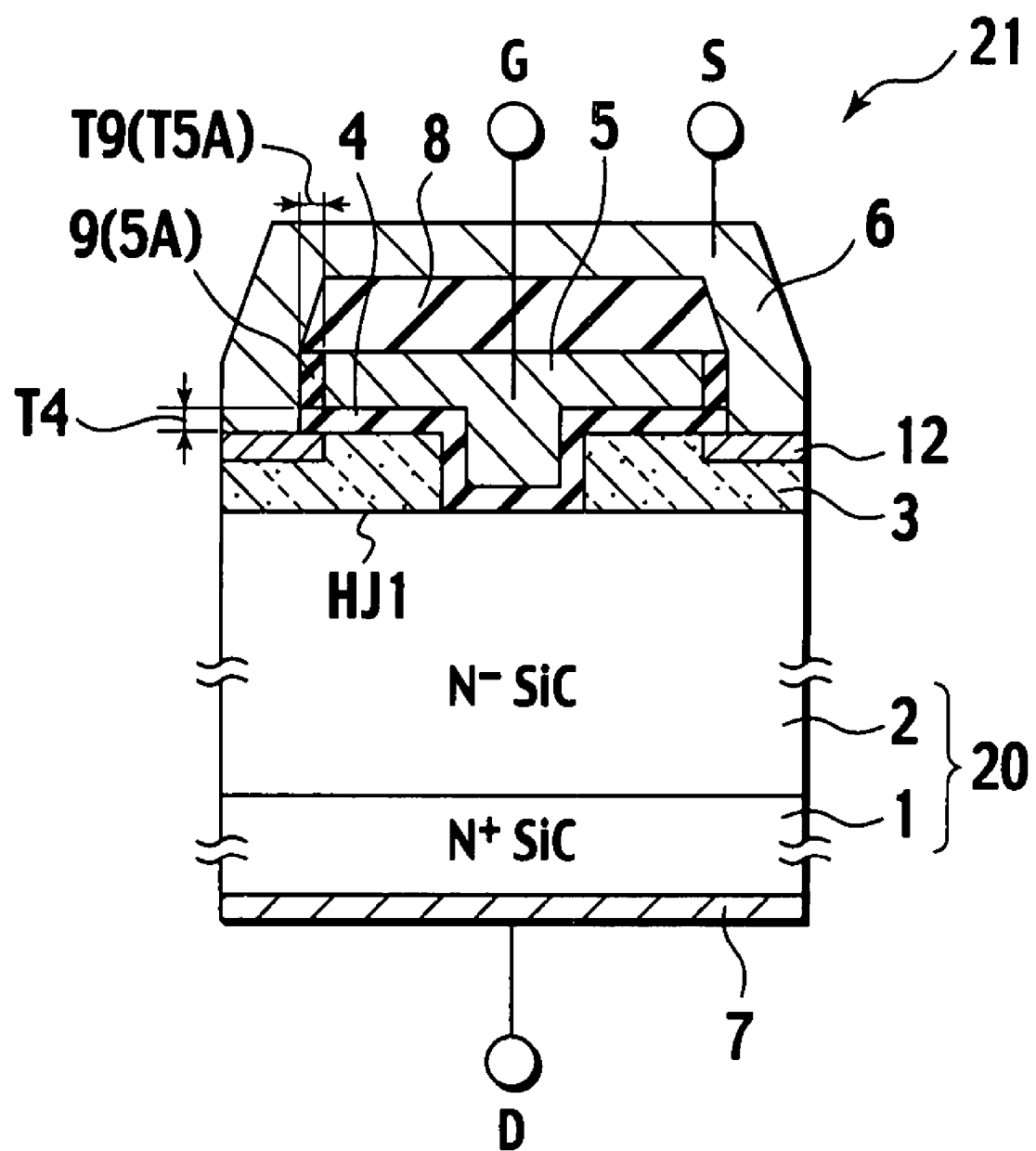
FIG. 6 is a cross sectional view showing a structure of the semiconductor device produced by a method, according to a third embodiment of the present invention.
Figure 7A:
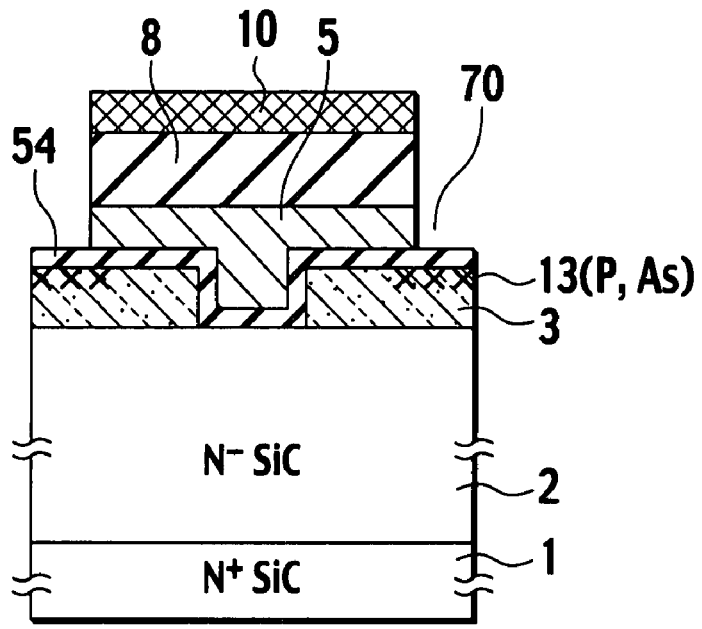
FIGS. 7A and 7B are cross sectional views showing a first production operation for the semiconductor device in FIG. 6.
Figure 7B:
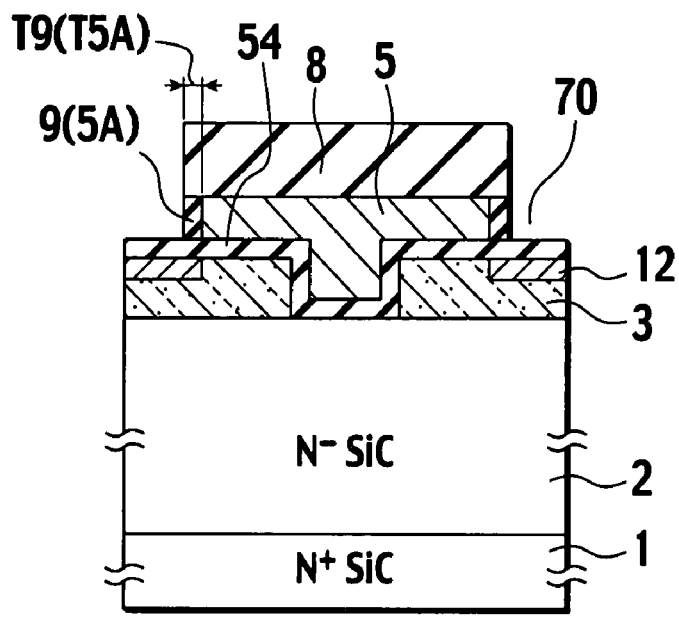
Figure 8:
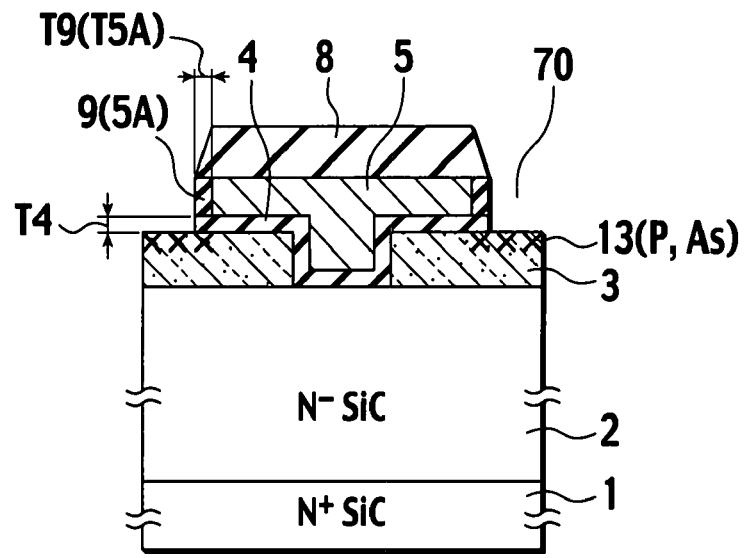
FIG. 8 is a cross sectional view showing a second production operation for the semiconductor device in FIG. 6.

Then, a method for producing the semiconductor device 21 according to the third embodiment is to be set forth referring to FIG. 6 to FIG. 8, focusing on points different from those of the method according to the first embodiment. Moreover, the semiconductor device 21 produced by the method according to the third embodiment has the same reference numerals or signs for structural elements like those according to the first embodiment, and therefore repeated description of the like structural elements is to be omitted.

<Structure>

At first, the semiconductor device 21 produced by the method according to the third embodiment is to be set forth, referring to FIG. 6. FIG. 6 is a cross sectional view showing a structure of the semiconductor device 21 produced by the method, according to the third embodiment of the present invention. As shown in FIG. 6, basically, the semiconductor device 21 according to the third embodiment has a structure substantially the same as that of the semiconductor device 21 according to the first embodiment. The semiconductor device 21 according to the third embodiment differs from that according to the first embodiment in that a source contact region 12 which is lower in resistance than the hetero semiconductor region 3 is formed between the source electrode 6 and the hetero semiconductor region 3. With this, an effect like that brought about according to the first embodiment can be brought about according to the third embodiment. Moreover, the source electrode 6 and the hetero semiconductor region 3 connected via the source contact region 12 can further decrease the on-resistance. Moreover, for example, even when the source electrode 6 is connected with a P type hetero semiconductor region 3 (opposite in conductivity type to the N− type drift region 2) or with an N type hetero semiconductor region 3 (having lower impurity concentration), the source contact region 12 disposed in between allows the hetero semiconductor region 3 and the source electrode 6 to have a contact at a low resistance (advantage), thus meeting both high reverse blocking voltage and low on-resistance.

<Production Method—First Production Operation>

Then, a first production operation for the semiconductor device 21 according to the third embodiment is to be set forth, referring to FIGS. 7A and 7B. FIGS. 7A and 7B are cross sectional views showing the first production operation for the semiconductor device 21 in FIG. 6. The first production operation for the semiconductor device 21 according to the third embodiment has in advance substantially the same operations in FIG. 2A to FIG. 2D and FIG. 3A according to the first embodiment. In the first production operation, as shown in FIG. 7A, an impurity, i.e., phosphor or arsenic is introduced into the surface layer of the hetero semiconductor region 3 by, for example, an ion implantation method, to thereby form an impurity introducing region 13. Besides, the first production operation according to the third embodiment has an advantage of selectively introducing the impurity. Then, as shown in FIG. 7B, the mask material 10 is removed, and then the sideface layer 5A exposed by the etching is oxidized by, for example, the heat oxidizing method, to thereby form the insulating region 9. Substantially simultaneously, the impurity introducing region 13 formed in the hetero semiconductor region 3 is activated, to thereby form the source contact region 12. Besides, like the first embodiment, the thickness T5A of the sideface layer 5A subjected to the heat oxidizing is fine-controllable, depending on type, temperature and time period of the oxidizing method such as dry $O_2$ oxidizing method, $H_2O$ oxidizing method and the like. Therefore, a lower limit of the thickness T5A of the sideface layer 5A can be easily accomplished for at least insulating the gate electrode 5 from the source electrode 6. Then, as shown in FIG. 6, like the first embodiment, the gate insulating film layer 54 is etched by, for example, the reactive ion etching (dry etching), thus exposing the surface of the source contact region 12 and forming the gate insulating film 4. Moreover, the drain electrode 7 is formed by the operation like that according to the first embodiment. The source electrode 6 is formed in such a configuration as to inconsecutively contact with the surface of the source contact region 12, the sideface of the gate insulating film 4, the sideface of the insulating region 9 and the interlayer insulating film 8. With this, the semiconductor device 21 according to the third embodiment is finally produced by the first production operation.

<Production Method—Second Production Operation>

Moreover, the semiconductor device 21 according to the third embodiment can also be produced by a second production operation in FIG. 8. FIG. 8 is a cross sectional view showing the second production operation for the semiconductor device 21 in FIG. 6. The second production operation for the semiconductor device 21 according to the third embodiment has in advance substantially the same operations in FIG. 2A to FIG. 2D and FIG. 3A to FIG. 3C according to the first embodiment. In the second production operation, as shown in FIG. 8, an impurity, i.e., phosphor or arsenic is introduced into the surface layer of the hetero semiconductor region 3 by, for example, an ion implantation method, to thereby form the impurity introducing region 13. Then, the impurity introducing region 13 is activated, to thereby form the source contact region 12. Then, the drain electrode 7 is formed by the operation like that according to the first embodiment. The source electrode 6 is formed in such a configuration as to inconsecutively contact with the surface of the source contact region 12, the sideface of the gate insulating film 4, the sideface of the insulating region 9 and the interlayer insulating film 8. With this, the semiconductor device 21 according to the third embodiment is finally produced by the second production operation.

As set forth above, any of the first and second production operations for the semiconductor device 21 according to the third embodiment can form the source contact region 12 between the source electrode 6 and the hetero semiconductor region 3.

As set forth above, any of the first and second production operations for the semiconductor device 21 according to the third embodiment can bring about an effect like that brought about according to the first embodiment. Moreover, the source electrode 6 and the hetero semiconductor region 3 connected via the source contact region 12 can further decrease the on-resistance. Moreover, for example, even when the source electrode 6 is connected with the P type hetero semiconductor region 3 (opposite in conductivity type to the N− type drift region 2) or with the N type hetero semiconductor region 3 (having lower impurity concentration), the source contact region 12 disposed in between allows the hetero semiconductor region 3 and the source electrode 6 to have a contact at a low resistance (advantage), thus meeting both high reverse blocking voltage and low on-resistance.

Fourth Embodiment

Figure 9:
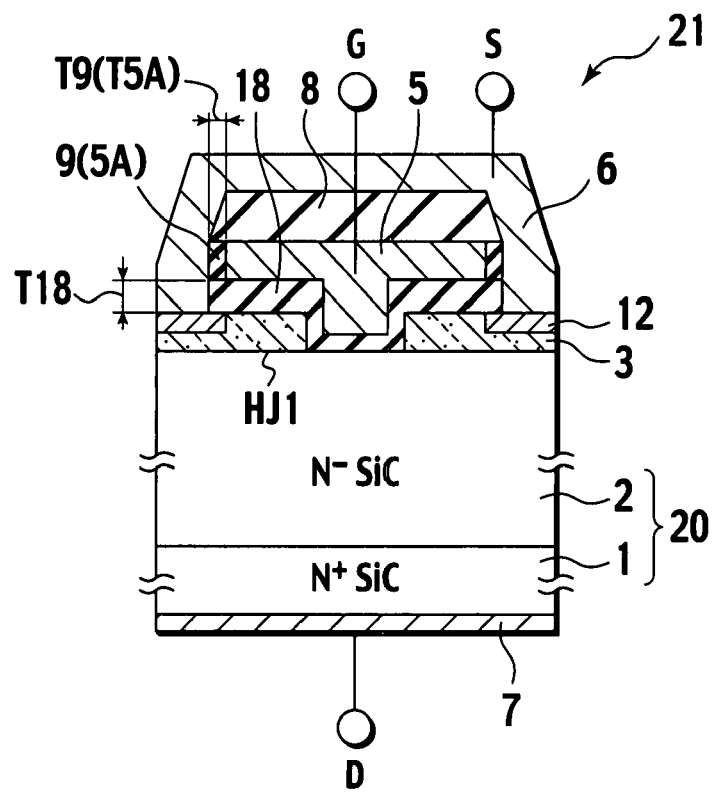
FIG. 9 is a cross sectional view showing a structure of a semiconductor device produced by a method, according to a fourth embodiment of the present invention.

Then, a method for producing the semiconductor device 21 according to the fourth embodiment is to be set forth referring to FIG. 9 to FIG. 10, focusing on points different from those of the method according to the second embodiment. Moreover, the semiconductor device 21 produced by the method according to the fourth embodiment has the same reference numerals or signs for structural elements like those according to the second embodiment, and therefore repeated description of the like structural elements is to be omitted.

<Structure>

At first, the semiconductor device 21 produced by the method according to the fourth embodiment is to be set forth, referring to FIG. 9. FIG. 9 is a cross sectional view showing a structure of the semiconductor device 21 produced by the method, according to the fourth embodiment of the present invention. As shown in FIG. 9, basically, the semiconductor device 21 according to the fourth embodiment has the structure substantially the same as that of the semiconductor device 21 according to the second embodiment. The semiconductor device 21 according to the fourth embodiment differs from that according to the second embodiment in that the source contact region 12 which is lower in resistance than the hetero semiconductor region 3 is formed between the source electrode 6 and the hetero semiconductor region 3. With this, an effect like that brought about according to the second embodiment can be brought about according to the fourth embodiment. Moreover, the source electrode 6 and the hetero semiconductor region 3 connected via the source contact region 12 can further decrease the on-resistance. Moreover, for example, even when the source electrode 6 is connected with the P type hetero semiconductor region 3 (opposite in conductivity type to the N− type drift region 2) or with the N type hetero semiconductor region 3 (having lower impurity concentration), the source contact region 12 disposed in between allows the hetero semiconductor region 3 and the source electrode 6 to have a contact at a low resistance (advantage), thus meeting both high reverse blocking voltage and low on-resistance.

<Production Method>

Figure 10A:
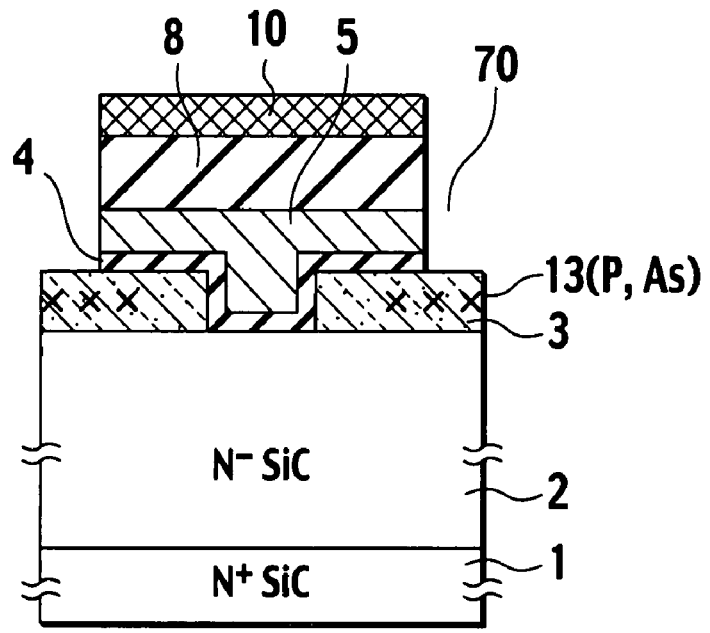
FIGS. 10A and 10B are cross sectional views showing operations for producing the semiconductor device in FIG. 9.
Figure 10B:
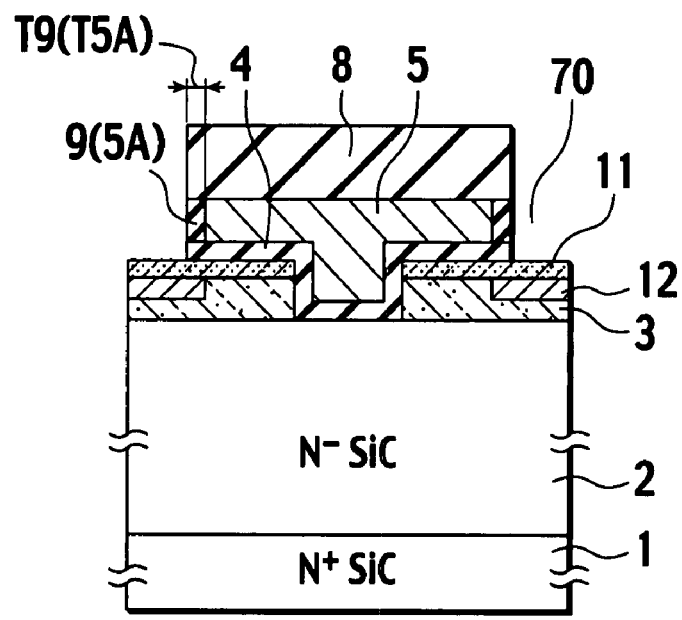

Then, the method for producing the semiconductor device 21 according to the fourth embodiment is to be set forth, referring to FIG. 10. FIGS. 10A and 10B are cross sectional views showing the operations for producing the semiconductor device 21 in FIG. 9. The production method for the semiconductor device 21 according to the fourth embodiment has in advance substantially the same operations in FIG. 2A to FIG. 2D and FIG. 5A according to the second embodiment. According to the fourth embodiment, as shown in FIG. 10A, an impurity, i.e., phosphor or arsenic is introduced into the hetero semiconductor region 3 by, for example, an ion implantation method, to thereby form the impurity introducing region 13. Then, as shown in FIG. 10B, the mask material 10 is removed, and then the sideface layer 5A exposed by the etching is oxidized by, for example, the heat oxidizing method, to thereby form the insulating region 9. Substantially simultaneously, the impurity introducing region 13 formed in the hetero semiconductor region 3 is activated, to thereby form the source contact region 12. Moreover, like the second embodiment, the heat oxidizing progresses from the hetero semiconductor region 3's surface exposed by the operation in FIG. 10A, thus forming the hetero semiconductor oxidized region 11 also on the surface layer of the hetero semiconductor region 3. The impurity, i.e., phosphor or arsenic is introduced into the hetero semiconductor region 3 by, for example, the ion implantation method in the operation for forming the impurity introducing region 13. The above impurity introducing, however, avoids the hetero semiconductor region 3's surface layer for forming the hetero semiconductor oxidized region 11. Besides, like the second embodiment, the thickness T5A of the sideface layer 5A subjected to the heat oxidizing is fine-controllable, depending on type, temperature and time period of the oxidizing method such as dry $O_2$ oxidizing method, $H_2O$ oxidizing method and the like. Therefore, a lower limit of the thickness T5A of the sideface layer 5A can be easily accomplished for at least insulating the gate electrode 5 from the source electrode 6.

Then, like the second embodiment, the hetero semiconductor oxidized region 11 according to the fourth embodiment is etched by, for example, the reactive ion etching (dry etching), thus exposing the surface of the source contact region 12 and forming the gate insulating film 18. Finally, as shown in FIG. 9, an operation like that according to the second embodiment forms the drain electrode 7. The source electrode 6 is formed in such a configuration as to inconsecutively contact with the surface of the source contact region 12, the sideface of the gate insulating film 18, the sideface of the insulating region 9 and the interlayer insulating film 8. With this, the semiconductor device 21 according to the fourth embodiment is finally produced.

As set forth above, the method for producing the semiconductor device 21 according to the fourth embodiment can bring about an effect like that brought about according to the second embodiment. Moreover, the source electrode 6 and the hetero semiconductor region 3 connected via the source contact region 12 can further decrease the on-resistance. Moreover, for example, even when the source electrode 6 is connected with the P type hetero semiconductor region 3 (opposite in conductivity type to the N− type drift region 2) or with the N type hetero semiconductor region 3 (having lower impurity concentration), the source contact region 12 disposed in between allows the hetero semiconductor region 3 and the source electrode 6 to have a contact at a low resistance (advantage), thus meeting both high reverse blocking voltage and low on-resistance.

Fifth Embodiment

Figure 11:
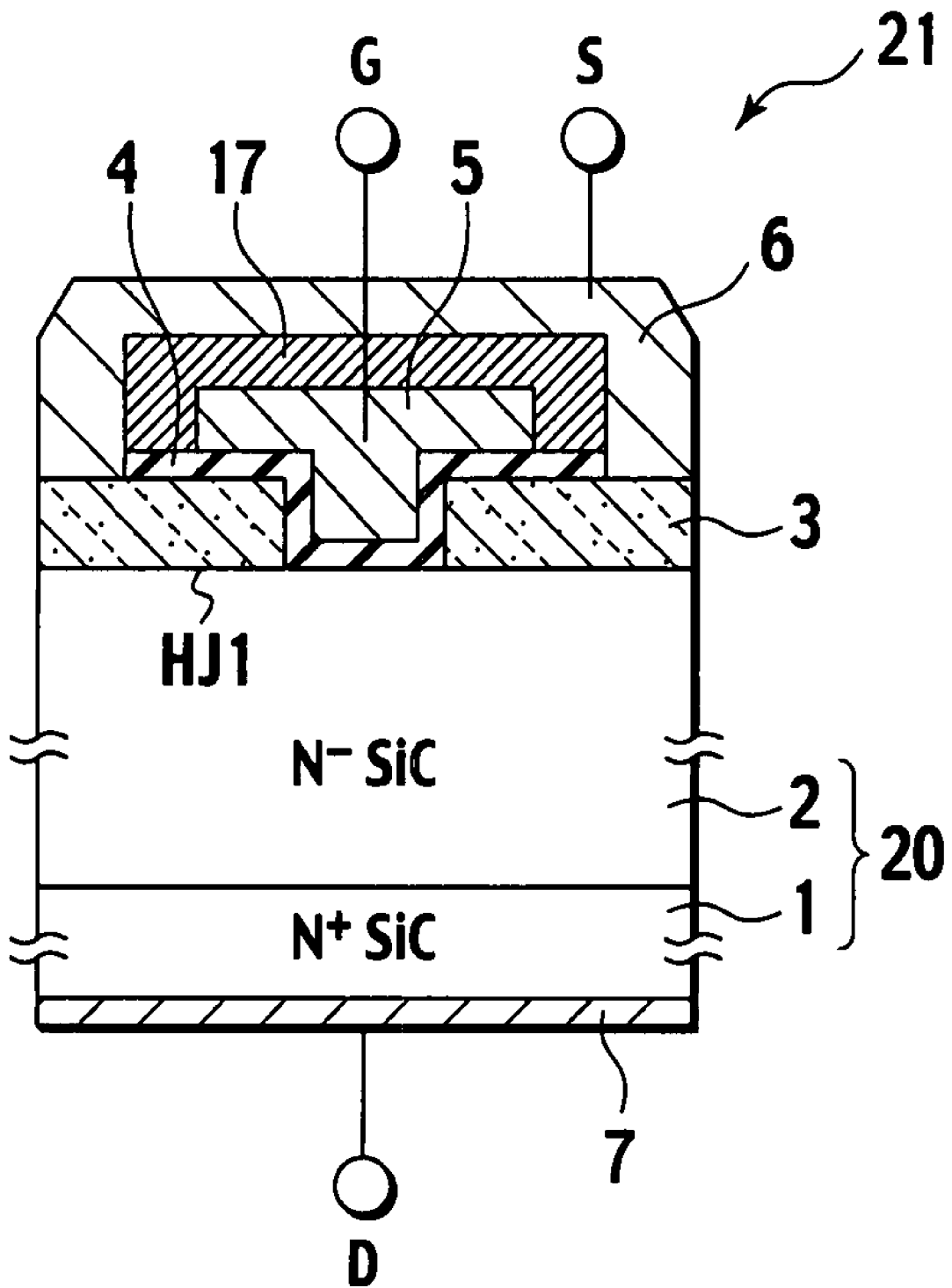
FIG. 11 is a cross sectional view showing a structure of a semiconductor device produced by a method, according to a fifth embodiment of the present invention.

Then, a method for producing the semiconductor device 21 according to the fifth embodiment is to be set forth referring to FIG. 11 to FIG. 12, focusing on points different from those of the method according to the first embodiment. Moreover, the semiconductor device 21 produced by the method according to the fifth embodiment has the same reference numerals or signs for structural elements like those according to the first embodiment, and therefore repeated description of the like structural elements is to be omitted.

<Structure>

At first, the semiconductor device 21 produced by the method according to the fifth embodiment is to be set forth, referring to FIG. 11. FIG. 11 is a cross sectional view showing a structure of the semiconductor device 21 produced by the method, according to the fifth embodiment of the present invention. As shown in FIG. 11, basically, the semiconductor device 21 according to the fifth embodiment has a structure substantially the same as that of the semiconductor device 21 according to the first embodiment. The semiconductor device 21 according to the fifth embodiment differs from that according to the first embodiment in that a gate electrode oxidized region 17 replaces the interlayer insulating film 8 and insulating region 9 for insulating the gate electrode 5 from the source electrode 6. With this, an effect like that brought about according to the first embodiment can be brought about according to the fifth embodiment.

<Production Method>

Then, the method for producing the semiconductor device 21 according to the fifth embodiment is to be set forth, referring to FIGS. 12. 12A, 12B, 12C and 12D are cross sectional views showing operations for producing the semiconductor device 21 in FIG. 11. The production method for the semiconductor device 21 according to the fifth embodiment has in advance substantially the same operations in FIG. 2A to FIG. 2B according to the first embodiment. According to the fifth embodiment, as shown in FIG. 12A, the gate insulating film layer 54 made of silicon oxidized film is formed on the hetero semiconductor region 3 and the drift region 2's exposed surface by, for example, an LP-CVD method, followed by depositing of the gate electrode layer 55 made of polycrystalline silicon by, for example, LP-CVD method. Then, an impurity, i.e., phosphor or arsenic is introduced into the gate electrode layer 55 by, for example, the ion implantation method, to thereby form an N type gate electrode layer 55. Then, as shown in FIG. 12B, the certain mask material 10 made of photoresist is formed on the gate electrode layer 55 by, for example, photolithography, then, the gate electrode layer 55 is selectively etched by for example, the reactive ion etching (dry etching) and is patterned. The operation in FIG. 12B patterns the gate electrode 5. Substantially simultaneously, the source contact hole 70 for the source electrode 6 is formed. Then, as shown in FIG. 12C, the mask material 10 is removed. Then, the gate electrode 5's exposed surface layer is oxidized by, for example, the heat oxidizing method, to thereby form the gate electrode oxidized region 17. Besides, thickness T17 of the gate electrode oxidized region 17 is fine-controllable, depending on type, temperature and time period of the oxidizing method such as dry $O_2$ oxidizing method, $H_2O$ oxidizing method and the like. Therefore, a lower limit of the thickness T17 of the gate electrode oxidized region 17 can be easily accomplished for at least insulating the gate electrode 5 from the source electrode 6.

Figure 12A:
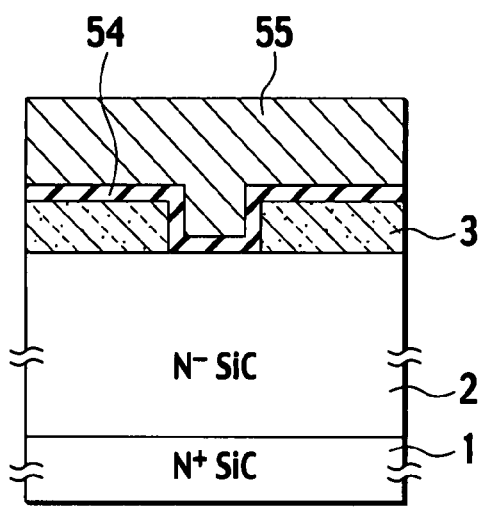
FIG. 12A, FIG. 12B, FIG. 12C and FIG. 12D are cross sectional views showing operations for producing the semiconductor device in FIG. 11.
Figure 12B:
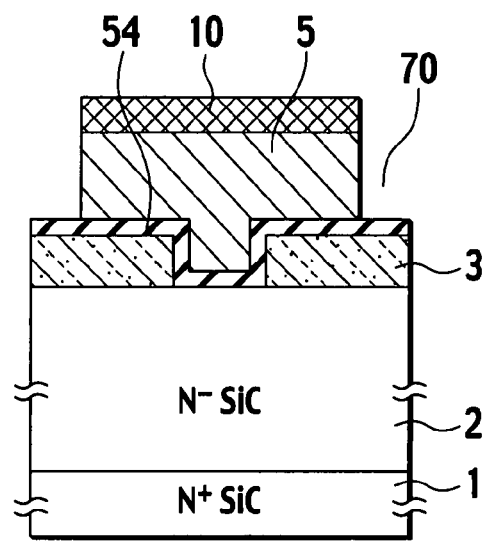
Figure 12C:
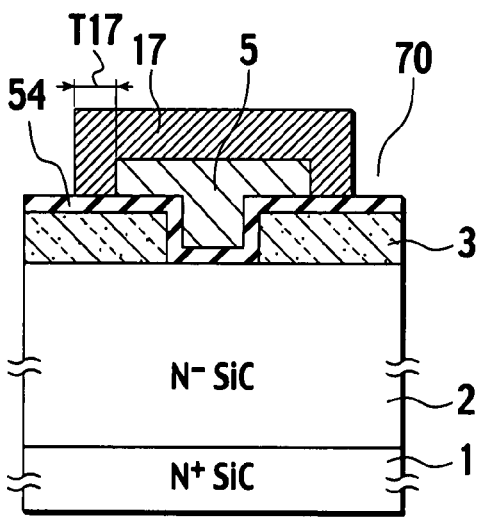
Figure 12D:
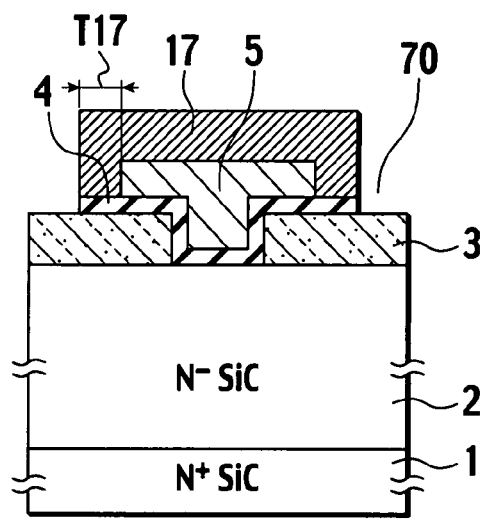

Then, as shown in FIG. 12D, the gate insulating film layer 54 is etched by, for example, the reactive ion etching (dry etching), thus exposing the surface of the hetero semiconductor region 3 and forming the gate insulating film 4. Finally, as shown in FIG. 11, the drain electrode 7 is formed by the operation like that according to the first embodiment. The source electrode 6 is formed in such a configuration as to inconsecutively contact with the surface of the hetero semiconductor region 3, the sideface of the gate insulating film 4 and the gate electrode oxidized region 17. With this, the semiconductor device 21 according to the fifth embodiment is finally produced.

As set forth above, the method for producing the semiconductor device 21 according to the fifth embodiment can form the gate electrode oxidized region 17 for insulating the gate electrode 5 from the source electrode 6. With this, an effect like that brought about according to the first embodiment can be brought about according to the fifth embodiment. Moreover, according to the fifth embodiment, the semiconductor device 21 like that according to the first embodiment can be made by the production method easier than that according to the first embodiment. Moreover, the gate electrode oxidized region 17 formed by the heat oxidizing method can further improve the insulating property and reliability.

Sixth Embodiment

Figure 20:
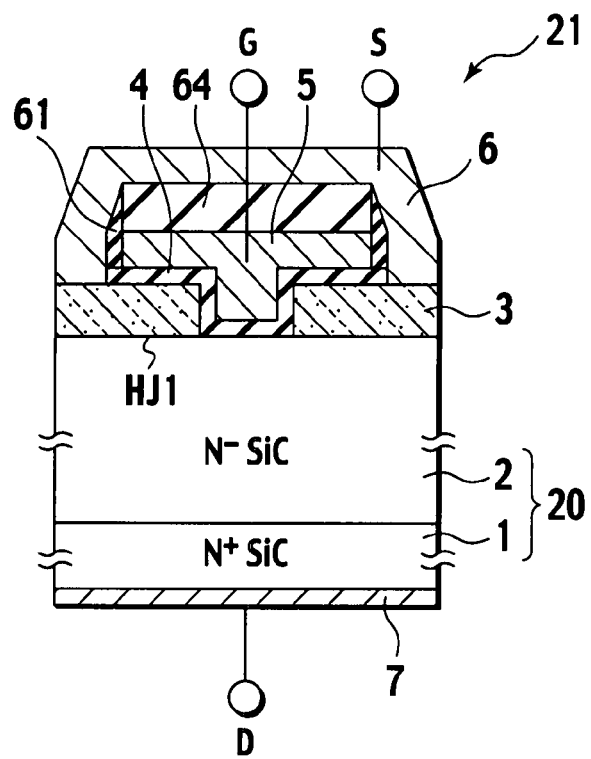
FIG. 20 is a cross sectional view showing a structure of a semiconductor device produced by a method, according to a sixth embodiment of the present invention.

Then, a method for producing the semiconductor device 21 according to the sixth embodiment is to be set forth referring to FIG. 20 to FIG. 21, focusing on points different from those of the method according to the first embodiment. Moreover, the semiconductor device 21 produced by the method according to the sixth embodiment has the same reference numerals or signs for structural elements like those according to the first embodiment, and therefore repeated description of the like structural elements is to be omitted.

<Structure>

At first, the semiconductor device 21 produced by the method according to the sixth embodiment is to be set forth, referring to FIG. 20. FIG. 20 is a cross sectional view showing a structure of the semiconductor device 21 produced by the method, according to the sixth embodiment of the present invention. As shown in FIG. 20, basically, the semiconductor device 21 according to the sixth embodiment has a structure substantially the same as that of the semiconductor device 21 according to the first embodiment. The semiconductor device 21 according to the sixth embodiment differs from that according to the first embodiment in that an interlayer insulating film 64 as a first interlayer insulating film replaces the interlayer insulating film 8 and that an insulating region 61 replaces the insulating region 9. According to the first embodiment, the sideface layer 5A is oxidized by, for example, the heat oxidizing method, to thereby form the insulating region 9. According to the sixth embodiment, however, an insulating film 62 (refer to FIG. 21D) deposited by the CVD method and the like forms the insulating region 61 (refer to FIG. 21E). With this, an effect like that brought about according to the first embodiment can be brought about according to the sixth embodiment.

Herein, the insulating region 9 according to the first embodiment is the silicon oxidized film formed by heat oxidizing the sideface layer 5A of the gate electrode 5 which has the base material, i.e., the gate electrode layer 55 made of polycrystalline silicon. Generally, the silicon oxidized film deposited by the CVD method and the like is higher in dielectric breakdown field than the silicon oxidized film formed by heat oxidizing the polycrystalline silicon. Therefore, the sixth embodiment can bring about the semiconductor device 21 which is higher in reliability than that according to the first embodiment.

<Production Method>

Then, the method for producing the semiconductor device 21 according to the sixth embodiment is to be set forth, referring to FIG. 21. FIG. 21A to FIG. 21E are cross sectional views showing operations for producing the semiconductor device 21 in FIG. 20. The production method for the semiconductor device 21 according to the sixth embodiment has in advance substantially the same operations in FIG. 2A to FIG. 2B according to the first embodiment. According to the sixth embodiment, as shown in FIG. 21A, the gate insulating film layer 54 made of silicon oxidized film is formed on the hetero semiconductor region 3 and the drift region 2's exposed surface by, for example, LP-CVD method, like the first embodiment. After the forming of the gate insulating film layer 54, the gate electrode layer 55 made of polycrystalline silicon is deposited by, for example, the LP-CVD method. Then, like the first embodiment, an impurity, i.e., phosphor or arsenic is introduced into the gate electrode layer 55 as the base material for the gate electrode 5 by, for example, the ion implantation method, to thereby form the N type gate electrode layer 55.

Moreover, like the first embodiment, the CVD method forms an interlayer insulating film layer 63 as a first interlayer insulating film layer.

Figure 21A:
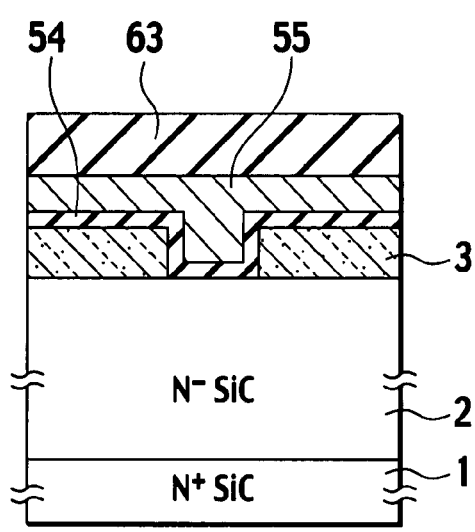
FIG. 21A, FIG. 21B, FIG. 21C, FIG. 21D and FIG. 21E are cross sectional views showing operations for producing the semiconductor device in FIG. 20.
Figure 21B:
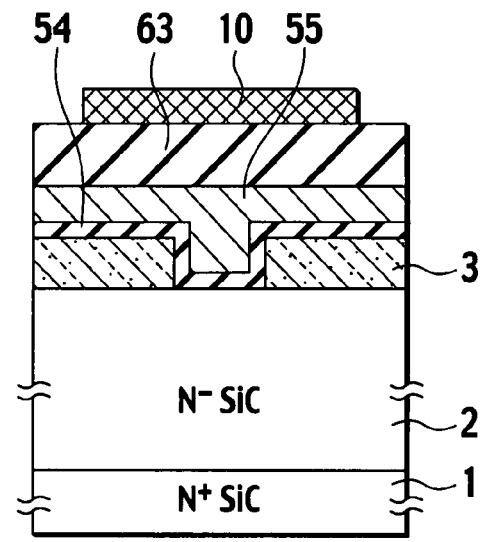
Figure 21C:
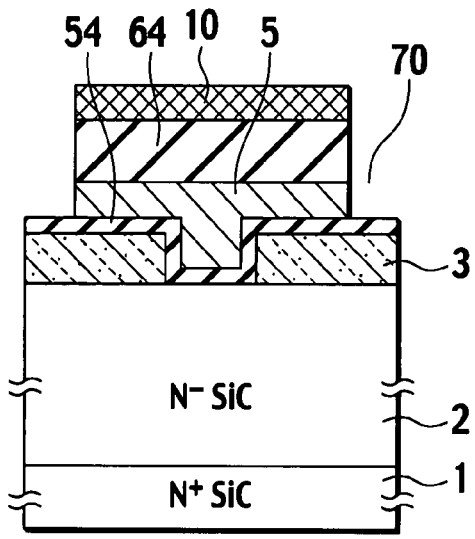
Figure 21D:
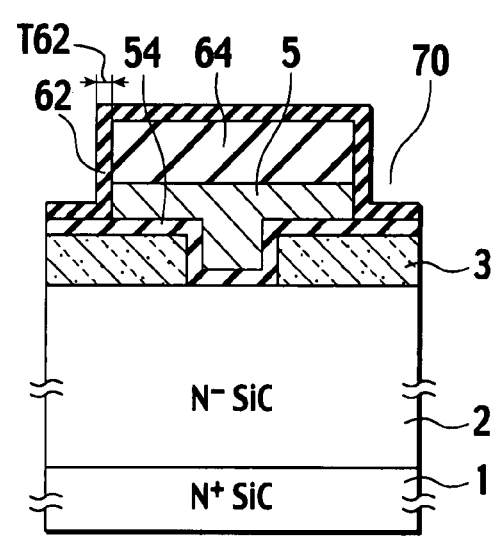

Then, as shown in FIG. 21B, the certain mask material 10 made of photoresist is formed on the interlayer insulating film layer 63 by, for example, photolithography, like the first embodiment. Then, as shown in FIG. 21C, like the first embodiment, the interlayer insulating film layer 63 and the gate electrode layer 55 are selectively etched by, for example, the reactive ion etching (dry etching), and are patterned into a certain form. Then, an operation in FIG. 21C forms the interlayer insulating film 64 as the first interlayer insulating film, and patterns the gate electrode 5. Substantially simultaneously, the source contact hole 70 for the source electrode 6 is formed. Then, as shown in FIG. 21D, the mask material 10 is removed, and then the insulating film 62 as a second interlayer insulating film is deposited on the gate electrode 5's sideface and on the interlayer insulating film 64 by, for example, the CVD method and the like. The insulating film 62 may be made of silicon oxidized film and the like. A lower limit of thickness T62 of the insulating film 62 is so set as to at least insulate the gate electrode 5 from the source electrode 6.

Figure 21E:
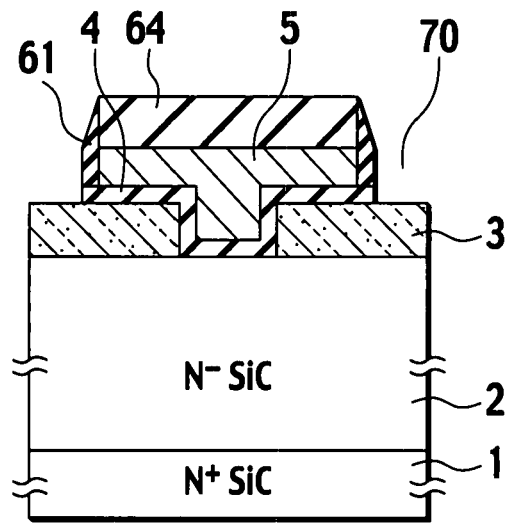

Then, as shown in FIG. 21E in combination with FIG. 21D, the insulating film 62 and the gate insulating film layer 54 are etched by, for example, the reactive ion etching (dry etching), thus exposing the surface of the hetero semiconductor region 3 and forming the gate insulating film 4 and insulating region 61. In the above operations, an anisotropy etching such as reactive ion etching and the like scarcely etches the insulating film 62 deposited on the sideface of the gate electrode 5 and therefore leaves the insulating film 62. With this, the insulating film 62 on the interlayer insulating film 64 and on the gate insulating film layer 54 can be selectively etched. Moreover, an edge part of the insulating film 62 has an increased surface subjected to the plasma or etching gas in the reactive ion etching and therefore is removed, causing an inclination by the etching. With this, the source electrode 6 has good coverage property, which is an advantage described afterward. Finally, as shown in FIG. 20, the operation like that according to the first embodiment forms the drain electrode 7. The source electrode 6 is formed in such a configuration as to inconsecutively contact with the exposed face of the hetero semiconductor region 3, the sideface of the gate insulating film 4, the insulating region 61 and the interlayer insulating film 64. With this, the semiconductor device 21 according to the sixth embodiment is finally produced.

As set forth above, according to the sixth embodiment, the method for producing the semiconductor device 21 can bring about an effect like that brought about according to the first embodiment. Moreover, according to the sixth embodiment, the insulating region 61 can be formed, with the following silicon oxidized film as base material:

The silicon oxidized film deposited by the CVD method and the like and higher in dielectric breakdown field than the silicon oxidized film formed by heat oxidizing the polycrystalline silicon.

The insulating region 61 insulates the gate electrode 5 from the source electrode 6. With this, the method according to the sixth embodiment can form the semiconductor device 21 which is higher in reliability than that according to the first embodiment.

Moreover, the edge part of the insulating film 62 is removed, in such a configuration as to cause the inclined etched part, thus improving coverage property of the source electrode 6.

Seventh Embodiment

Figure 22:
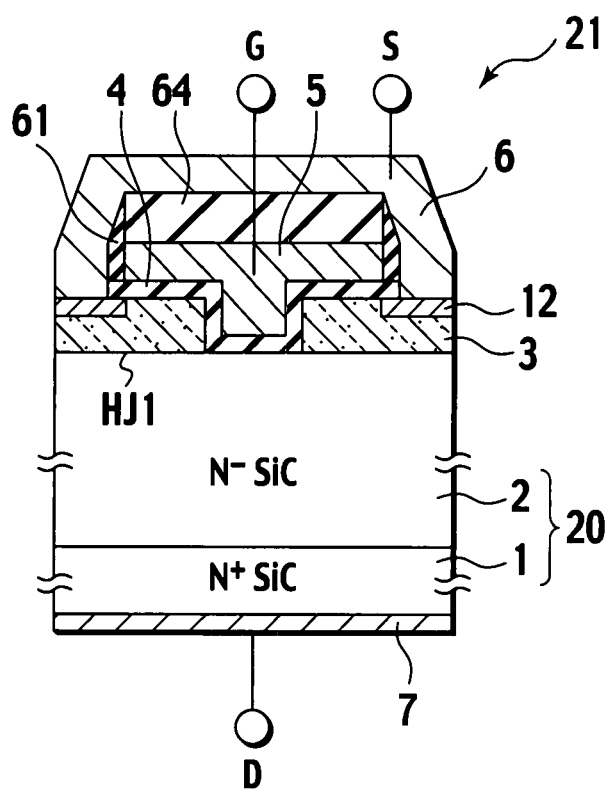
FIG. 22 is a cross sectional view showing a structure of a semiconductor device produced by a method, according to a seventh embodiment of the present invention.

Then, a method for producing the semiconductor device 21 according to the seventh embodiment is to be set forth referring to FIG. 22 to FIG. 23, focusing on points different from those of the method according to the sixth embodiment. Moreover, the semiconductor device 21 produced by the method according to the seventh embodiment has the same reference numerals or signs for structural elements like those according to the sixth embodiment, and therefore repeated description of the like structural elements is to be omitted.

<Structure>

At first, the semiconductor device 21 produced by the method according to the seventh embodiment is to be set forth, referring to FIG. 22. FIG. 22 is a cross sectional view showing a structure of the semiconductor device 21 produced by the method, according to the seventh embodiment of the present invention. As shown in FIG. 22, basically, the semiconductor device 21 according to the seventh embodiment has a structure substantially the same as that of the semiconductor device 21 according to the sixth embodiment. The semiconductor device 21 according to the seventh embodiment differs from that according to the sixth embodiment in that the source contact region 12 having resistance lower that of the hetero semiconductor region 3 is formed between the source electrode 6 and the hetero semiconductor region 3. With this, an effect like that brought about according to the sixth embodiment can be brought about according to the seventh embodiment. Moreover, the source electrode 6 and the hetero semiconductor region 3 connected via the source contact region 12 according to the seventh embodiment can decrease on-resistance more than according to the sixth embodiment. Moreover, for example, even when the source electrode 6 is connected with the P type hetero semiconductor region 3 (opposite in conductivity type to the N− type drift region 2) or with the N type hetero semiconductor region 3 (having lower impurity concentration), the source contact region 12 disposed in between allows the hetero semiconductor region 3 and the source electrode 6 to have a contact at a low resistance (advantage), thus meeting both high reverse blocking voltage and low on-resistance.

<Production Method>

Figure 23A:
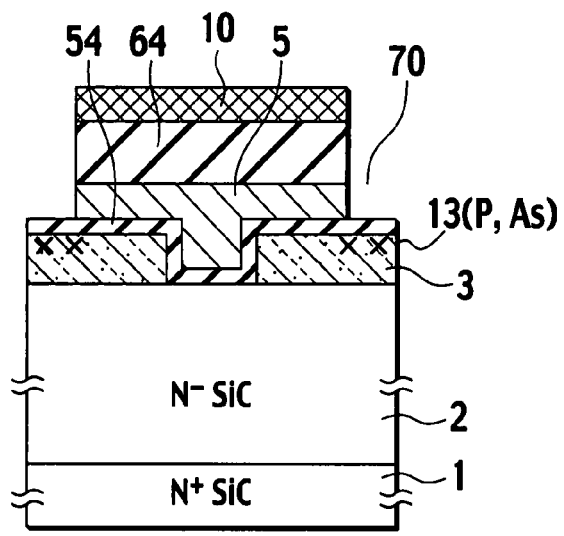
FIG. 23A, FIG. 23B are FIG. 23C are cross sectional views showing operations for producing the semiconductor device in FIG. 22.
Figure 23B:
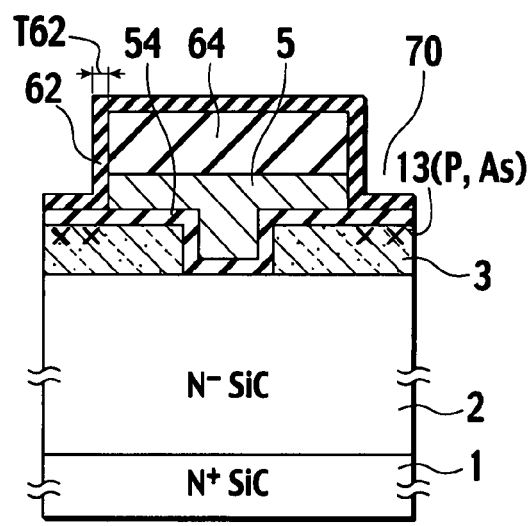
Figure 23C:
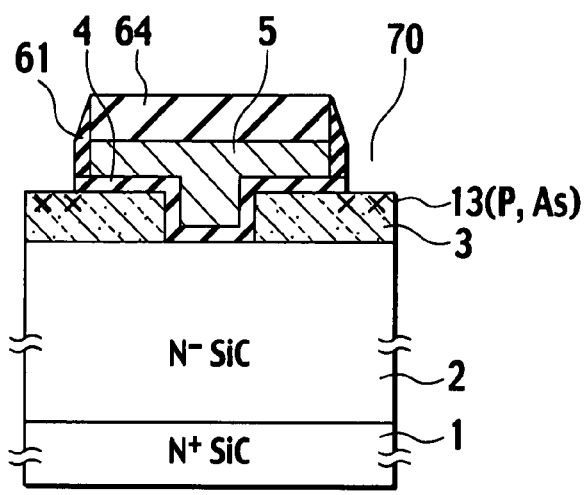

Then, the method for producing the semiconductor device 21 according to the seventh embodiment is to be set forth, referring to FIG. 23A to FIG. 23C. FIG. 23A to FIG. 23C are cross sectional views showing operations for producing the semiconductor device 21 in FIG. 22. The production method for the semiconductor device 21 according to the seventh embodiment has in advance substantially the same operations in FIGS. 2A to 2B and FIG. 21A to FIG. 21C according to the sixth embodiment. Then, as shown in FIG. 23A, an impurity, i.e., phosphor or arsenic is introduced into the surface layer of the hetero semiconductor region 3 by, for example, the ion implantation method, to thereby form the impurity introducing region 13. Then, as shown in FIG. 23B, the mask material 10 is removed, and then the insulating film 62 is deposited on the gate electrode 5's sideface and the interlayer insulating film 64 by, for example, the CVD method and the like. The insulating film 62 may be made of silicon oxidized film and the like. A lower limit of thickness of the insulating film 62 is so set as to at least insulate the gate electrode 5 from the source electrode 6.

Then, as shown in FIG. 23C in combination with FIG. 23B, the insulating film 62 and the gate insulating film layer 54 are etched by, for example, the reactive ion etching (dry etching), thus exposing the surface of the hetero semiconductor region 3 and forming the gate insulating film 4 and the insulating region 61. In the above operations, the anisotropy etching such as the reactive ion etching and the like scarcely etches the insulating film 62 deposited on the sideface of the gate electrode 5 and therefore leaves the insulating film 62. With this, the insulating film 62 on the interlayer insulating film 64 and on the gate insulating film layer 54 can be selectively etched.

Moreover, an edge part of the insulating film 62 has an increased surface subjected to the plasma or etching gas in the reactive ion etching and therefore is removed, causing an inclination by the etching. With this, the source electrode 6 has good coverage property, which is an advantage described afterward. Then, a high temperature heat treatment is implemented for activating the impurity of the impurity introducing region 13. Finally, as shown in FIG. 22, the operation like that according to the sixth embodiment forms the drain electrode 7. The source electrode 6 is formed in such a configuration as to inconsecutively contact with the exposed face of the hetero semiconductor region 3, the sideface of the gate insulating film 4, the insulating region 61 and the interlayer insulating film 64. With this, the semiconductor device 21 according to the seventh embodiment is finally produced.

As set forth above, according to the seventh embodiment, the method for producing the semiconductor device 21 can bring about an effect like that brought about according to the first embodiment, and the source contact region 12 lower in resistance than the hetero semiconductor region 3 can be formed between the source electrode 6 and the hetero semiconductor region 3. Thereby, the source electrode 6 and the hetero semiconductor region 3 connected via the source contact region 12 according to the seventh embodiment can decrease on-resistance more than according to the sixth embodiment.

According to the seventh embodiment, the impurity introduction into the surface layer of the hetero semiconductor region 3 is implemented before forming of the insulating region 61. However, the impurity introduction may be implemented after forming of the insulating region 61, followed by the activating heat treatment.

<Modifications and Variations>

The above described first to seventh embodiments are each one example of the present invention. Therefore, the range of the present invention is not limited to the first to seventh embodiments, and the present invention is applicable to various other embodiments within the range defined by the claims. For example, according to the first to seventh embodiments, the polycrystalline silicon layer 53 is formed by the LP-CVD method (see FIG. 2A). The present invention is, however, not specifically limited to this. The polycrystalline silicon layer 53 may be formed by recrystallization using a laser anneal and the like after being deposited by an electron beam evaporating method, a spattering method and the like. For example, replacing the polycrystalline silicon (of the layer 53), a single crystalline silicon which is hetero epitaxially grown by, for example, molecular beam epitaxy and the like may be used for the layer 53. Moreover, according to the first to seventh embodiments, the ion implantation method is used for introducing the impurity, i.e., phosphor or arsenic into the polycrystalline silicon layer 53. The present invention is, however, not specifically limited to this. Solid phase diffusion or gas phase diffusion can be used for doping the impurity.

Moreover, according to the first to seventh embodiments, the photoresist is used for the mask material (not shown) for forming the hetero semiconductor region 3 by etching the polycrystalline silicon layer 53. The present invention is, however, not specifically limited to this. Other materials such as SiO$_2$ film, SiN film and the like may be used. Moreover, according to the first to seventh embodiments, the polycrystalline silicon layer 53 is etched by the reactive ion etching (dry etching). The present invention is, however, not specifically limited to this. For example, after the oxidation by wet etching or heat oxidizing method is implemented, for example, a mix solution including ammonium fluoride and hydrofluoric acid can be used for removing oxidized film caused in the wet etching. Moreover, a method having combination of the above may be used. Moreover, though not implemented according to the first to seventh embodiments, sacrificial oxidation and oxidized film removal may be implemented after the etching of the polycrystalline silicon layer 53.

According to the first to seventh embodiments, the LP-CVD method forms the gate insulating film layer 54. The present invention is, however, not specifically limited to this. The heat oxidizing method, a plasma CVD method or the like may be used. Moreover, according to the first to seventh embodiments, the silicon oxidized film is used for the gate insulating film layer 54. The present invention is, however, not specifically limited to this. Any other materials such as SiN and the like having insulating property are allowed. Moreover, according to the first and third embodiments, the reactive ion etching (dry etching) etches the gate insulating film layer 54. The present invention is, however, not specifically limited to this. For example, wet etching or other etching method is allowed as long as the insulating region 9 has a sufficient certain thickness after the etching. Moreover, according to the sixth and seventh embodiments, the reactive ion etching (dry etching) etches the insulating film 62 and the gate insulating film layer 54. The present invention is, however, not specifically limited to this. For example, wet etching or other etching method is allowed as long as the insulating region 61 has a sufficient certain thickness after the etching.

Moreover, according to the first to seventh embodiments, the polycrystalline silicon is used for the material for the gate electrode layer 55. The present invention is, however, not limited to this. Any other materials for serving as the gate electrode 5 and having high conductivity are applicable. In this case, like the first to fifth embodiment, the polycrystalline silicon, single crystalline silicon and polycrystalline silicon carbide and the like are used which are materials each having a surface on which an insulating property region can be easily formed especially by the heat oxidizing method and the like. Using the above materials can form the insulating region 9 with ease. Moreover, according to the first to seventh embodiments, the impurity, i.e., phosphor or arsenic is introduced into the gate electrode layer 55 by the ion implantation method. The present invention is, however, not limited to this. For doping the impurity, the solid phase diffusion or gas phase diffusion may be used. Moreover, the gate electrode layer 55 is formed by the LP-CVD method. The present invention is, however, not limited to this. The polycrystalline silicon layer 55 may be formed by recrystallization using a laser anneal and the like after being deposited by an electron beam evaporating method, a spattering method and the like.

Moreover, according to the first to seventh embodiments, the photoresist is used for the material for the mask material 10. The present invention is, however, not limited to this. Other materials such as SiO$_2$ film, Si film and the like may be used.

Moreover, according to the first to fourth, sixth and seventh embodiments, the material for the interlayer insulating film layers 58, 63 is not set forth. For example, any materials having at least insulating property are allowed, examples thereof including silicon oxidized film, SiN film and the like. Moreover, according to the first, third, sixth and seventh embodiments, the interlayer insulating film layers 58, 63 and the gate electrode layer 55 are etched by the reactive ion etching (dry etching). The present invention is, however, not limited to this. For example, wet etching may be used. Moreover, the interlayer insulating film layers 58, 63 and the gate electrode layer 55 may be patterned by the same etching method or a different etching method. Moreover, according to the first, third, sixth and seventh embodiments, the gate insulating film layer 54 is not etched in the operation for etching the interlayer insulating film layers 58, 63 and the gate electrode layer 55 by the reactive ion etching. The present invention is, however, not limited to this. As shown in the second embodiment, the gate insulating film layer 54 may be etched substantially simultaneously with the above operation.

Moreover, according to the second and fourth embodiments, the interlayer insulating film layer 58, the gate electrode layer 55 and the gate insulating film layer 54 are etched by the reactive ion etching (dry etching). The present invention is, however, not limited to this. For example, wet etching may be used. Moreover, the interlayer insulating film layer 58, the gate electrode layer 55 and the gate insulating film layer 54 may be patterned by the same etching method or a different etching method.

Moreover, according to the second and fourth embodiment, the hetero semiconductor oxidized region 11 is etched by the reactive ion etching (dry etching). The present invention is, however, not limited to this. For example, as long as the insulating region 9 has the sufficient certain thickness after the etching, wet etching or other etching method may be used.

Moreover, according to the third embodiment showing the first and second production operations and according to the fourth and seventh embodiments, the impurity, i.e., phosphor or arsenic is introduced into the hetero semiconductor region 3 by the ion implantation method to thereby form the impurity introducing region 13. The present invention is, however, not limited to this. For doping the impurity, solid phase diffusion or gas phase diffusion may be used.

First to Second Modified Embodiments

Figure 13:
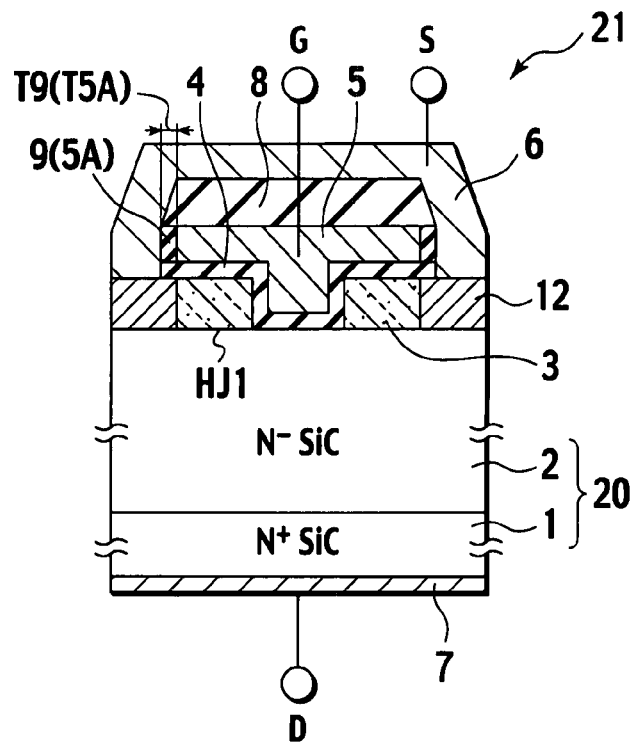
FIG. 13 is a cross sectional view of a first modified embodiment of the semiconductor device under the present invention.

Moreover, according to the third embodiment showing the first and second production operations and according to the seventh embodiment, the source contact region 12 is formed only on the surface layer of the hetero semiconductor region 3 in such a configuration as to have no contact with the drift region 2. The present invention is, however, not limited to this. As shown in FIGS. 13 (first modified embodiment) and 14 (second modified embodiment), the source contact region 12 may contact with the drift region 2, causing no problem.

Moreover, according to the third embodiment showing the first production operation and according to the fourth and seventh embodiments, the impurity is introduced into the hetero semiconductor region 3 with the mask material 10 present. The present invention is, however, not limited to this. After the mask material 10 is removed, the impurity may be introduced into the hetero semiconductor region 3 with the interlayer insulating film 8, 64 as a mask.

Moreover, according to the fifth embodiment, the gate electrode layer 55 is etched by the reactive ion etching (dry etching). The present invention is, however, not limited to this. The wet etching may be used, or a plurality of different etching methods are allowed.

Moreover, according to the fifth embodiment, the gate insulating film 18 (for replacing the gate insulating film 4) and the source contact region 12 are not formed. The present invention is, however, not limited to this. As set forth according to the second to fourth embodiments and shown in FIGS. 13 and 14, the gate insulating film 18 and the source contact region 12 may be formed. Moreover, for introducing the impurity so as to form the source contact region 12 in the hetero semiconductor region 3, the mask material 10 may be present or removed. For introducing the impurity with the mask material 10 removed (latter case), the impurity can be also introduced into the gate electrode 5 substantially simultaneously. Therefore, for example, in the forming of the gate electrode 5 and impurity introducing region 13 each of which is of N type, introducing an impurity, i.e., phosphor or arsenic into the gate electrode layer 55 shown in FIG. 12A can be omitted, which is an advantage.

Third to Seventh Modified Embodiments

Figure 14:
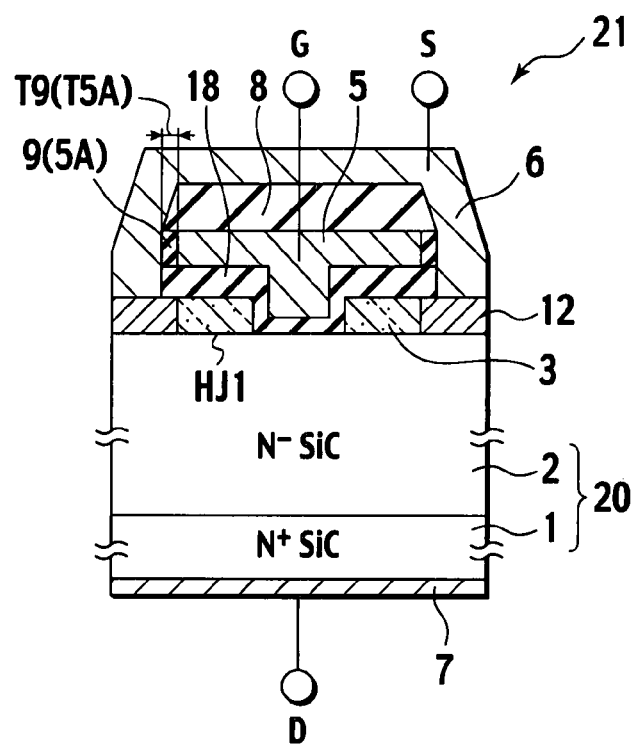
FIG. 14 is a cross sectional view of a second modified embodiment of the semiconductor device under the present invention.
Figure 15:
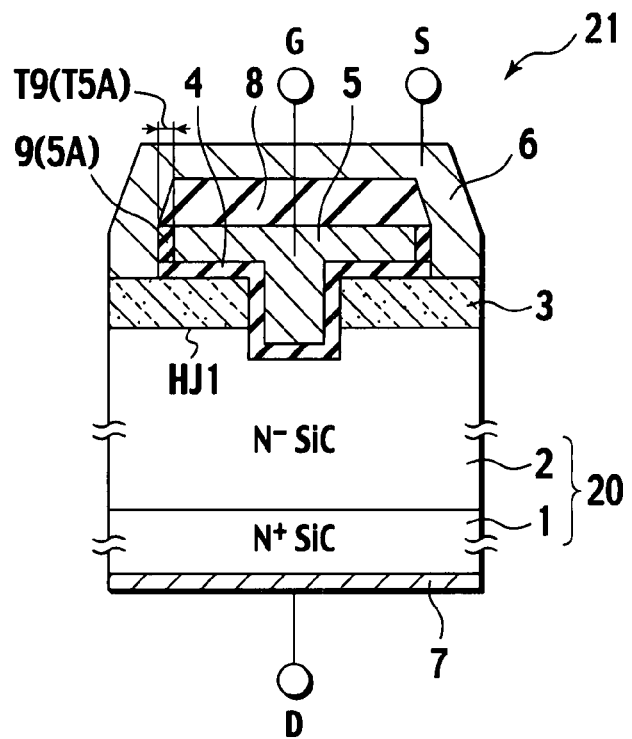
FIG. 15 is a cross sectional view of a third modified embodiment of the semiconductor device under the present invention.
Figure 16:
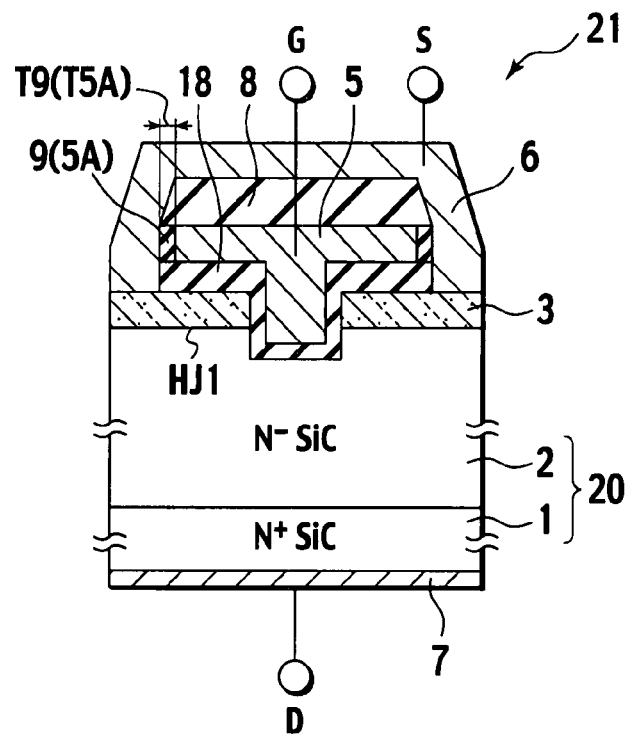
FIG. 16 is a cross sectional view of a fourth modified embodiment of the semiconductor device under the present invention.
Figure 17:
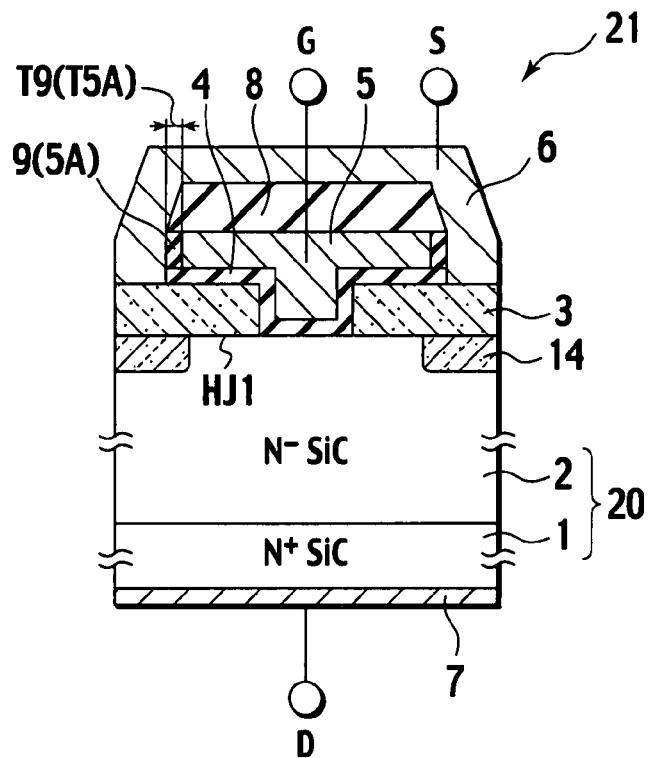
FIG. 17 is a cross sectional view of a fifth modified embodiment of the semiconductor device under the present invention.
Figure 18:
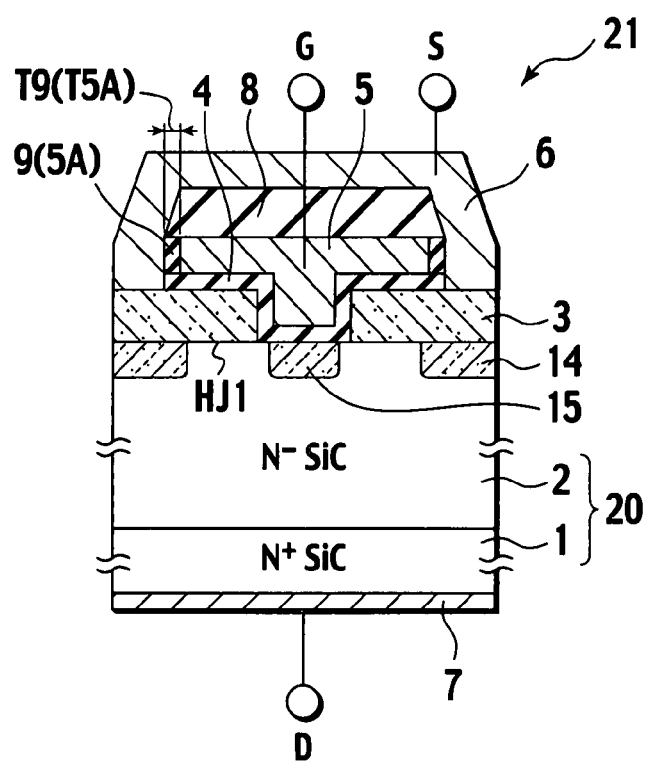
FIG. 18 is a cross sectional view of a sixth modified embodiment of the semiconductor device under the present invention.
Figure 19:
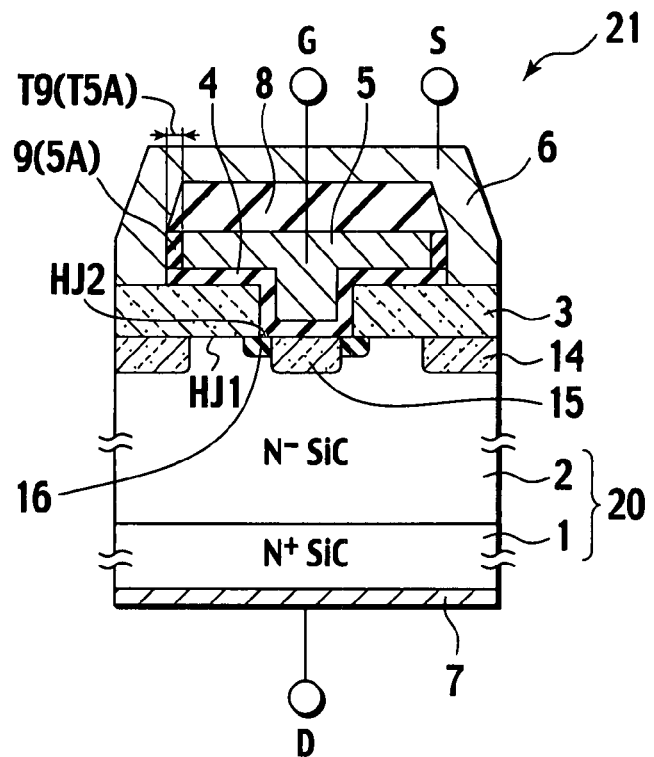
FIG. 19 is a cross sectional view of a seventh modified embodiment of the semiconductor device under the present invention.

Moreover, according to the first to seventh embodiments, two unit cells of the field effect transistor having the basic structure are opposed, forming the semiconductor device 21. The present invention is, however, not limited to this. As long as the production method for the insulating regions 9, 61 for insulating the gate electrode 5 from the source electrode 6 is like that of the present invention, any added structure or modified structure of the semiconductor device 21 is allowed. For example, as shown in FIG. 15 to FIG. 19 (respectively corresponding to third to seventh modified embodiments), the semiconductor device 21 produced by the method of the present invention can bring about a like effect. Herein, the first to seventh embodiments show what is called a planar type structure in which the drift region 2 is not dug in the patterning of the hetero semiconductor region 3. However, as shown in FIGS. 15 and 16, a structure for digging the drift region 2 is allowed. Moreover, according to the first to seventh embodiments, the side wall of the hetero semiconductor region 3 is vertical. However, the side wall of the hetero semiconductor region 3 may be inclined. Moreover, as shown in FIGS. 17 and 18, a first field relaxing region 14 or a second field relaxing region 15 may be present in the drift region 2. As shown in FIG. 17, forming the first field relaxing region 14 relaxes the electric field applied to the hetero junction HJ1 between the hetero semiconductor region 3 and the drift region 2 in the cutoff state, thereby decreasing leak current, resulting in improved cutoff performance. Moreover, as shown in FIG. 18, forming the second field relaxing region 15 relaxes the electric field applied to the gate insulating film 4, thereby decreasing dielectric breakdown of the gate insulating film 4, resulting in improved reliability. The first field relaxing region 14 and second field relaxing region 15 each may be of P type, or may have high resistance region or insulating region. Though FIG. 18 shows both the second field relaxing region 15 and the first field relaxing region 14, the second field relaxing region 15 alone may be formed. Likewise, as shown in FIG. 19, an N+ type conductive region 16 higher in impurity concentration than the drift region 2 may be formed in the drift region 2's certain part with which the gate insulating film 4 and hetero semiconductor region 3 have a contact. Though FIG. 19 shows the conductive region 16, the second field relaxing region 15 and the first field relaxing region 14 in combination, the conductive region 16 alone may be formed. Otherwise, the conductive region 16 may be formed in combination with any one of the second field relaxing region 15 and the first field relaxing region 14. The above structure can relax an energy barrier of a hetero junction HJ2 between the hetero semiconductor region 3 and the conductive region 16 in the conduction state, thus bringing about a higher conductivity. That is, the on-resistance can be further decreased, thus improving the conduction performance. The source contact region 12 is not formed in FIGS. 15 and 16. However, the source contact region 12 may be formed in FIGS. 15 and 16, like the third, fourth and seventh embodiments or as shown in FIGS. 13 and 14. In addition, the source contact region 12 and hetero semiconductor oxidized region 11 are not formed in FIG. 17 to FIG. 19. However, the source contact region 12 and hetero semiconductor oxidized region 11 may be formed in FIG. 17 to FIG. 19, like the second to fourth embodiments or as shown in FIGS. 13 and 14.

Moreover, all the embodiments (i.e., the semiconductor device 21 according to the first to seventh embodiments, and the first to seventh modified embodiments shown respectively in FIG. 13 to FIG. 19) of the present invention use the silicon carbide as the material for the substrate region 1 and drift region 2. The present invention is, however, not limited to this. Other semiconductor materials such as gallium nitride, diamond and the like are usable. In addition, according to all the embodiments, silicon carbide is of 4H type (poly type). The present invention is, however, not limited to this. Other poly types such as 6H, 3C and the like are usable. In addition, according to all the embodiments, the drain electrode 7 and the source electrode 6 are so disposed as to oppose each other with the drift region 2 sandwiched therebetween, forming a structure where two unit cells of a longitudinal field effect transistor for longitudinally flowing the current are opposed. The present invention is, however, not limited to this. For example, the drain electrode 7 and the source electrode 6 may be disposed on one main face, in other words, a structure where unit cells of a lateral field effect transistor for laterally flowing the current are arranged is allowed.

Moreover, according to all the embodiments, the polycrystalline silicon is used as the material for the hetero semiconductor region 3 and hetero semiconductor oxidized region 11. The present invention is, however, not limited to this. Any materials capable of at least forming the hetero junction in combination with the silicon carbide are allowed, examples thereof including other silicon materials such as single crystalline silicon, amorphous silicon and the like, other semiconductor materials such as germanium, silicon germane and the like, and other poly type of silicon carbide such as 6H, 3C and the like. Moreover, according to all the embodiments, the drift region 2 is made of N type silicon carbide and the hetero semiconductor region 3 is made of N type polycrystalline silicon. The present invention is, however, not limited to this. The drift region 2 and the hetero semiconductor region 3 may be any of i) N type silicon carbide and P type polycrystalline silicon, ii) P type silicon carbide and P type polycrystalline silicon, and iii) P type silicon carbide and N type polycrystalline silicon.

Moreover, according to the fifth embodiment, the gate insulating film layer 54 is etched by the reactive ion etching (dry etching). The present invention is, however, not limited to this. The wet etching or other etching method is allowed.

This application is based on a prior Japanese Patent Application Nos. P2006-282504 (filed on Oct. 17, 2006 in Japan) and P2007-158860 (filed on Jun. 15, 2007 in Japan). The entire contents of the Japanese Patent Application Nos. P2006-282504 and P2007-158860 from which priorities are claimed are incorporated herein by reference, in order to take some protection against translation errors or omitted portions.

The scope of the present invention is defined with reference to the following claims.

What is claimed is:

1. A method for producing a semiconductor device which includes:
   a semiconductor base,
   a hetero semiconductor region made of a semiconductor material different in band gap from a semiconductor material for the semiconductor base, and so configured as to form a hetero junction in combination with the semiconductor base,
   a gate insulating film so configured as to contact with the hetero junction between the semiconductor base and the hetero semiconductor region,
   a gate electrode so configured as to contact with the gate insulating film,
   a source electrode connected to the hetero semiconductor region, and
   a drain electrode connected to the semiconductor base, the method comprising:
   forming the gate electrode and a source contact hole for the source electrode in a self-aligning manner, by using a mask material; and
   forming an insulating region between the gate electrode and the source contact hole,
   wherein the insulating region is formed from a sideface layer of the gate.

2. The method for producing the semiconductor device according to claim 1, wherein
   the insulating region is formed by oxidizing a part of the gate electrode.

3. The method for producing the semiconductor device according to claim 1, further comprising:
   introducing an impurity into an impurity introducing region which is a part of the hetero semiconductor region, and
   forming, thereby, a source contact region between the source electrode and the hetero semiconductor region, the source contact region being lower in resistance than the hetero semiconductor region.

4. The method for producing the semiconductor device according to claim 2, further comprising:
   introducing an impurity into an impurity introducing region which is a part of the hetero semiconductor region, and
   forming, thereby, a source contact region between the source electrode and the hetero semiconductor region, the source contact region being lower in resistance than the hetero semiconductor region, and
   activating the impurity substantially simultaneously with the forming operation of the insulating region.

5. The method for producing the semiconductor device according to claim 3, wherein
   after the forming operation of the gate electrode, the introducing operation of the impurity is implemented before the mask material is removed.

6. The method for producing the semiconductor device according to claim 4, wherein
   after the forming operation of the gate electrode, the introducing operation of the impurity is implemented before the mask material is removed.

7. The method for producing the semiconductor device according to claim 1, wherein
   the forming operation of the source contact hole uses a dry etching.

8. The method for producing the semiconductor device according to claim 1, wherein
   the gate electrode is made of a material selected from the group consisting of:
   polycrystalline silicon,
   single crystalline silicon, and
   polycrystalline silicon carbide.

9. The method for producing the semiconductor device according to claim 1, wherein
   the semiconductor base is made of a material selected from the group consisting of: silicon carbide, diamond, and gallium nitride.

10. The method for producing the semiconductor device according to claim 1, wherein
    the hetero semiconductor region is made of a material selected from the group consisting of:
    single crystalline silicon,
    polycrystalline silicon, and
    amorphous silicon.

* * * * *